(12) United States Patent
Ogawa et al.

(10) Patent No.: US 11,817,039 B2
(45) Date of Patent: Nov. 14, 2023

(54) DISPLAY DEVICE

(71) Applicant: Japan Display Inc., Tokyo (JP)

(72) Inventors: Akihiro Ogawa, Minato-ku (JP); Masanobu Ikeda, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/592,743

(22) Filed: Feb. 4, 2022

(65) Prior Publication Data

US 2022/0157229 A1    May 19, 2022

Related U.S. Application Data

(63) Continuation of application No. PCT/JP2020/022735, filed on Jun. 9, 2020.

(30) Foreign Application Priority Data

Aug. 8, 2019  (JP) ................. 2019-146796

(51) Int. Cl.
G09G 3/32 (2016.01)
H01L 27/15 (2006.01)

(52) U.S. Cl.
CPC .............. *G09G 3/32* (2013.01); *H01L 27/156* (2013.01); *G09G 2310/08* (2013.01); *G09G 2320/0233* (2013.01); *G09G 2320/041* (2013.01); *G09G 2330/021* (2013.01)

(58) Field of Classification Search
CPC ............... G09G 3/32; G09G 2310/08; G09G 2320/0233; G09G 2320/041; G09G 2330/021; G09G 2300/0426; G09G 2300/0814; G09G 2320/045; H01L 27/156; H01L 25/0753; H01L 25/167; H01L 33/62; G09F 9/30; G09F 9/33

See application file for complete search history.

(56) References Cited

U.S. PATENT DOCUMENTS

| | | | |
|---|---|---|---|
| 2011/0090006 A1* | 4/2011 | Yamazaki | H01L 29/7869 327/581 |
| 2012/0248435 A1* | 10/2012 | Koyama | H01L 27/1225 257/43 |
| 2015/0364107 A1 | 12/2015 | Sakariya et al. | |
| 2016/0300900 A1* | 10/2016 | Miyake | G09G 3/3233 |
| 2017/0032728 A1* | 2/2017 | Shima | H01L 27/1225 |

(Continued)

FOREIGN PATENT DOCUMENTS

| | | |
|---|---|---|
| CN | 109360838 A | 2/2019 |
| JP | 2009-288956 A | 12/2009 |
| JP | 2017-529557 A | 10/2017 |

OTHER PUBLICATIONS

International Search Report dated Aug. 18, 2020 in PCT/JP2020/022735 filed on Jun. 9, 2020, 6 pages (with English Translation).

*Primary Examiner* — Andrew Sasinowski
(74) *Attorney, Agent, or Firm* — Maier & Maier, PLLC

(57) ABSTRACT

A display device includes a substrate, a plurality of pixels provided to the substrate, a plurality of first light emitting elements provided to each of the pixels and configured to output visible light, a pixel circuit provided to the substrate and configured to supply a drive signal to each of the first light emitting elements, and a second light emitting element provided to the pixel circuit and configured to output infrared light.

9 Claims, 16 Drawing Sheets

(56) References Cited

U.S. PATENT DOCUMENTS

| | | |
|---|---|---|
| 2017/0064291 A1* | 3/2017 | Do .................. H04N 13/324 |
| 2017/0213502 A1 | 7/2017 | Henry et al. |
| 2018/0018917 A1 | 1/2018 | Yoo et al. |
| 2020/0126477 A1 | 4/2020 | Henry et al. |
| 2020/0294752 A1 | 9/2020 | Sun et al. |
| 2021/0217356 A1 | 7/2021 | Henry et al. |

* cited by examiner

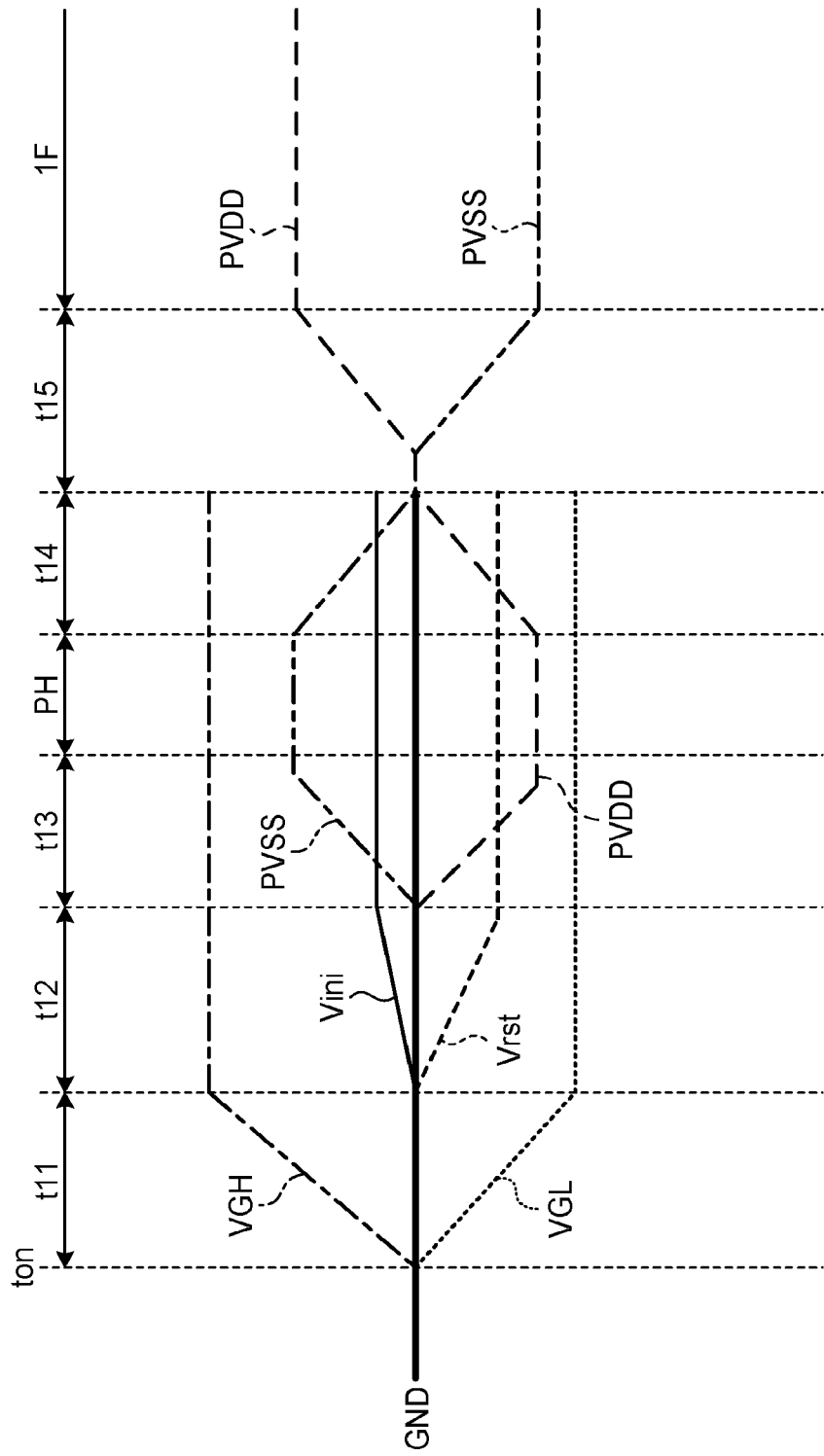

DISPLAY DEVICE

CROSS-REFERENCE TO RELATED APPLICATION

This application is a continuation of International Patent Application No. PCT/JP2020/022735 filed on Jun. 9, 2020 which designates the United States, incorporated herein by reference, and which claims the benefit of priority from Japanese Patent Application No. 2019-146796 filed on Aug. 8, 2019, incorporated herein by reference.

BACKGROUND

1. Technical Field

The present disclosure relates to a display device.

2. Description of the Related Art

Displays with micro light emitting diodes (micro LEDs) serving as display elements have recently been attracting attention (refer to Japanese Translation of PCT International Application Publication No. 2017-529557 (JP-T-2017-529557), for example). A plurality of LEDs are coupled to an array substrate (or a driver backplane in JP-T-2017-529557). The array substrate includes pixel circuits (or electronic control circuits in JP-T-2017-529557) that drive the LEDs.

The luminous efficiency of LEDs decreases with a rise in temperature. In display devices provided with LEDs, luminance may possibly decrease with a rise in temperature, thereby deteriorating display characteristics.

SUMMARY

A display device according to an embodiment of the present disclosure includes a substrate, a plurality of pixels provided to the substrate, a plurality of first light emitting elements provided to each of the pixels and configured to output visible light, a pixel circuit provided to the substrate and configured to supply a drive signal to each of the first light emitting elements, and a second light emitting element provided to the pixel circuit and configured to output infrared light.

BRIEF DESCRIPTION OF THE DRAWINGS

FIG. 16 is a timing chart illustrating changes in power supply voltages when the display device according to a second modification of the third embodiment starts.

DETAILED DESCRIPTION

Figure 1:
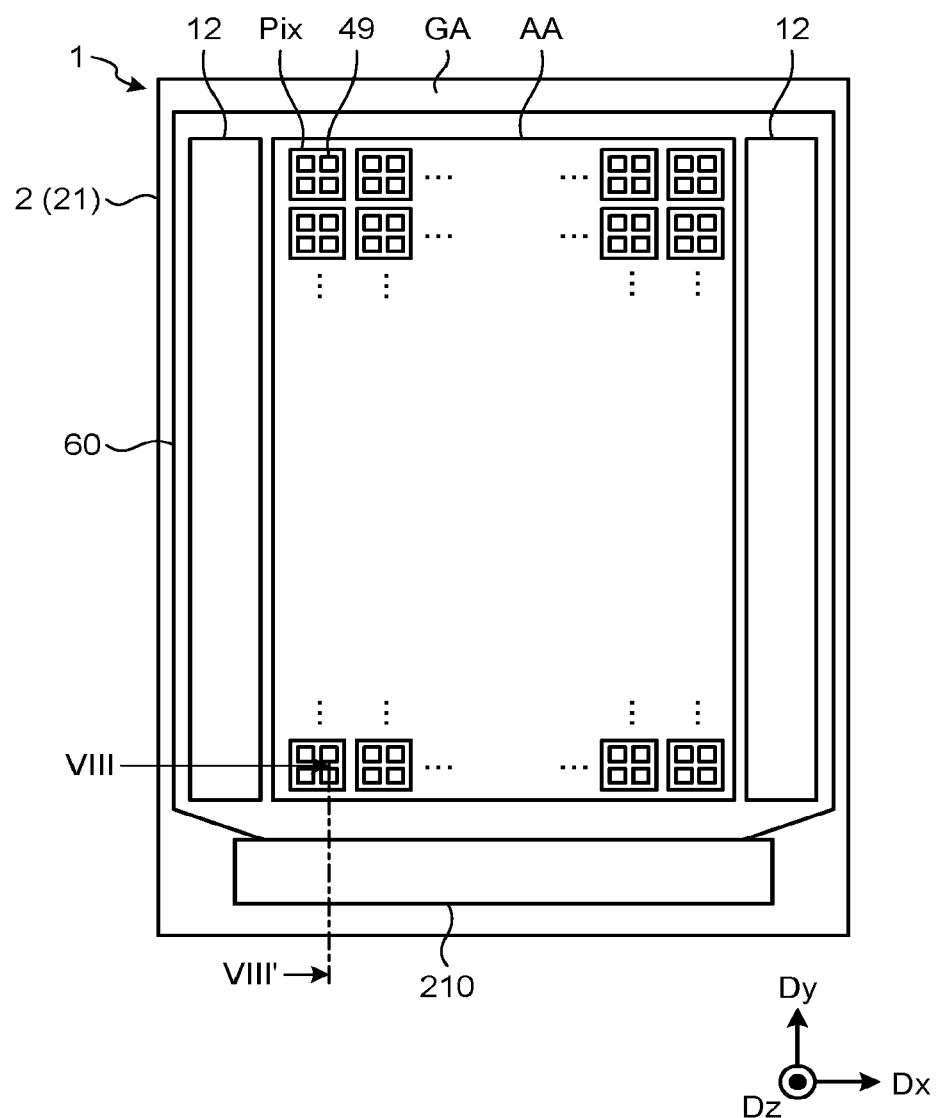
FIG. 1 is a plan view schematically illustrating a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

In the present specification and the accompanying claims, to express an aspect where a first structure is disposed on a second structure, the term "on" includes both of the following cases if not specially defined: the case where the first structure is disposed directly on the second structure in contact with the second structure and the case where the first structure is disposed on the second structure with another structure interposed therebetween.

First Embodiment

FIG. 1 is a plan view schematically illustrating a display device according to a first embodiment. As illustrated in FIG. 1, a display device 1 includes an array substrate 2, pixels Pix, drive circuits 12, a drive integrated circuit (IC) 210, and cathode wiring 60. The array substrate 2 is a drive circuit board for driving the pixels Pix and is also called a backplane or an active matrix substrate. The array substrate 2 includes a substrate 21, a plurality of transistors, a plurality of capacitances, and various kinds of wiring, for example. Flexible printed circuits (FPCs), which are not particularly illustrated, may be mounted on and coupled to the array substrate 2 to receive electric power and control signals for driving the drive circuits 12 and the drive IC 210, for example.

As illustrated in FIG. 1, the display device 1 has a display region AA and a peripheral region GA. The display region AA is disposed overlapping the pixels Pix and displays an image. The peripheral region GA does not overlap the pixels Pix and is disposed outside the display region AA.

The pixels Pix are arrayed in a first direction Dx and a second direction Dy in the display region AA of the substrate 21. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation when viewed in the third direction Dz.

The drive circuits 12 drive a plurality of gate lines (e.g., a light emission control scanning line BG, a reset control scanning line RG, an initialization control scanning line IG, a writing control scanning line SG, and a heat generation control scanning line HG (refer to FIG. 3)) based on various control signals received from the drive IC 210 or the outside. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 1. The drive IC 210 is mounted on the peripheral region GA of the substrate 21 as chip on glass (COG). The mounting form of the drive IC 210 is not limited thereto, and the drive IC 210 may be mounted on FPCs or a rigid substrate coupled to the peripheral region GA of the substrate 21 as chip on film (COF).

The cathode wiring 60 is provided in the peripheral region GA of the substrate 21. The cathode wiring 60 is provided surrounding the pixels Pix in the display region AA and the drive circuits 12 in the peripheral region GA. Cathodes of a plurality of first light emitting elements 31 are electrically coupled to the common cathode wiring 60 and supplied with a fixed potential (e.g., a ground potential). More specifically, a cathode terminal 34 (refer to FIG. 7) of the first light emitting element 31 is coupled to the cathode wiring 60 via a cathode electrode 22 (second electrode).

Figure 2:
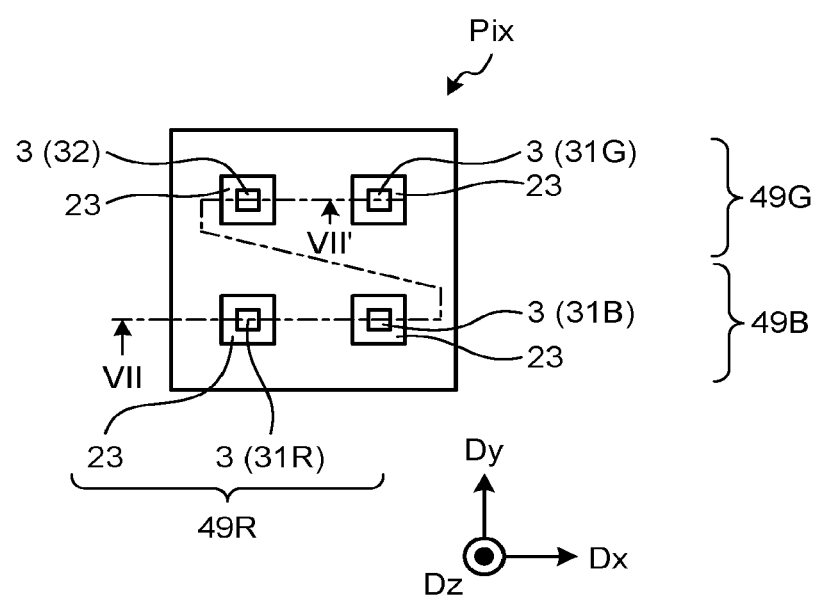
FIG. 2 is a plan view of one pixel Pix.

FIG. 2 is a plan view of one pixel Pix. As illustrated in FIG. 2, one pixel Pix includes a plurality of sub-pixels 49. The pixel Pix includes a first sub-pixel 49R, a second sub-pixel 49G, and a third sub-pixel 49B, for example. The first sub-pixel 49R displays a primary color of red as the first color. The second sub-pixel 49G displays a primary color of green as the second color. The third sub-pixel 49B displays a primary color of blue as the third color. As illustrated in FIG. 2, the first sub-pixel 49R and the third sub-pixel 49B in one pixel Pix are disposed side by side in the first direction Dx. The second sub-pixel 49G and the third sub-pixel 49B are disposed side by side in the second direction Dy. The first color, the second color, and the third color are not limited to red, green, and blue, respectively, and may be any desired colors, such as complementary colors. In the following description, the first sub-pixel 49R, the second sub-pixel 49G, and the third sub-pixel 49B are referred to as sub-pixels 49 when they need not be distinguished from one another.

The sub-pixels 49 each include a first light emitting element 31R, 31G, or 31B and an anode electrode 23 (first electrode). One pixel Pix further includes a second light emitting element 32. The first light emitting elements 31R, 31G, and 31B output visible light. The wavelength range of visible light is approximately 380 nm to 780 nm, for example. The second light emitting element 32 outputs infrared light. The wavelength range of infrared light is approximately 780 nm to 1000 nm, for example. In the following description, the first light emitting elements 31R, 31G, and 31B and the second light emitting element 32 are simply referred to as light emitting elements 3 when they need not be distinguished from one another. The first light emitting elements 31R, 31G, and 31B are simply referred to as first light emitting elements 31 when they need not be distinguished from one another.

The first sub-pixel 49R, the second sub-pixel 49G, and the third sub-pixel 49B are provided with the first light emitting elements 31R, 31G, and 31B, respectively. The display device 1 displays an image by outputting different light (e.g., red light, green light, and blue light) from the first light emitting elements 31R, 31G, and 31B in the first sub-pixel 49R, the second sub-pixel 49G, and the third sub-pixel 49B, respectively.

The display device 1 can heat the first light emitting elements 31R, 31G, and 31B by outputting infrared light from the second light emitting element 32. Alternatively, the display device 1 can detect biological information on an object to be detected, such as a finger Fg and a palm, based on the infrared light output from the second light emitting element 32. Examples of the biological information include, but are not limited to, fingerprint, blood vessel image (venous pattern) of the finger Fg and the palm, pulse wave, pulse, blood oxygen level, etc.

The light emitting elements 3 are provided to the respective sub-pixels 49. The light emitting element 3 is a light emitting diode (LED) chip having a size of approximately 3 μm to 300 μm in planar view. LEDs having a chip size of smaller than 100 μm are called micro-LEDs, although not a strict definition. The display device 1 including the micro-LEDs in the pixels is also called a micro-LED display device. The term "micro" of the micro-LED is not intended to limit the size of the light emitting element 3.

The first light emitting elements 31 may output different light in four or more colors. The positions of the sub-pixels 49 are not limited to the configuration illustrated in FIG. 2. The first sub-pixel 49R, for example, may be disposed side by side with the second sub-pixel 49G in the first direction Dx. The first sub-pixel 49R, the second sub-pixel 49G, and the third sub-pixel 49B may be repeatedly arrayed in this order in the first direction Dx.

While the second light emitting element 32 is schematically illustrated in FIGS. 1 and 2 in a manner distinguished from the first sub-pixel 49R, the second sub-pixel 49G, and the third sub-pixel 49B, the second light emitting element 32 may be included in any one of the first sub-pixel 49R, the second sub-pixel 49G, and the third sub-pixel 49B. In other words, a pixel circuit PICA of one sub-pixel 49 includes the first light emitting element 31 and the second light emitting element 32. The second light emitting element 32 is not necessarily provided to all the pixels Pix. One second light emitting element 32 may be provided to a plurality of pixels Pix, and the pixels Pix not including the second light emitting element 32 and the pixels Pix including the second light emitting element 32 may be arrayed.

Figure 3:
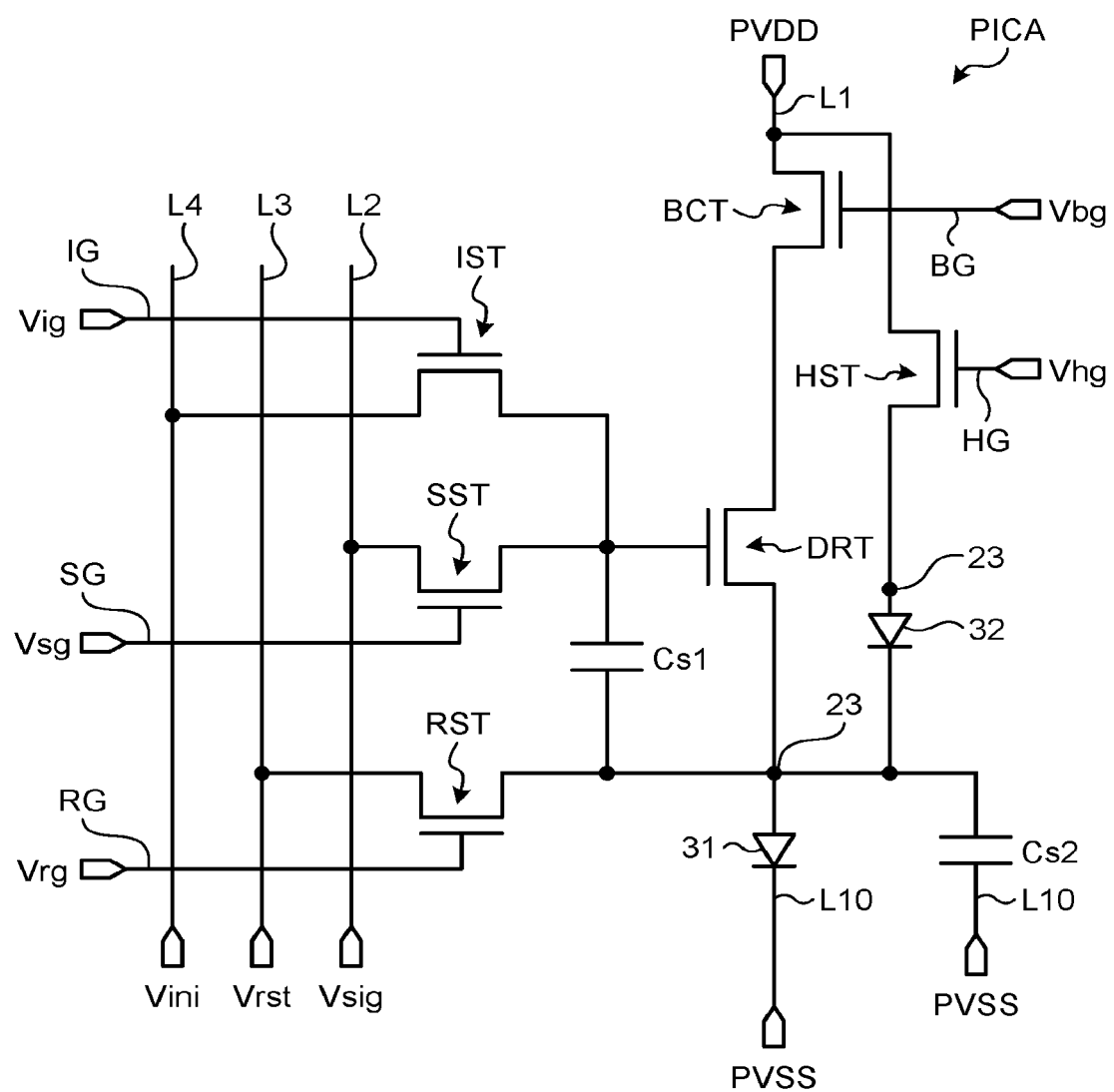
FIG. 3 is a circuit diagram of a pixel circuit.

FIG. 3 is a circuit diagram of a pixel circuit. The pixel circuit PICA is provided to the substrate 21 and supplies drive signals (electric current) to the first light emitting element 31. The following describes the pixel circuit PICA of the sub-pixel 49 (e.g., the first sub-pixel 49R) provided with the first light emitting element 31 and the second light emitting element 32 with reference to FIG. 3. The pixel circuit PICA of the sub-pixel 49 (e.g., the second sub-pixel 49G and the third sub-pixel 49B) not provided with the second light emitting element 32 has a circuit configuration obtained by eliminating the second light emitting element 32, a heat generation control transistor HST, and the heat generation control scanning line HG from the configuration illustrated in FIG. 3.

As illustrated in FIG. 3, the pixel circuit PICA includes the first light emitting element 31, the second light emitting element 32, six transistors, and two capacitances. Specifically, the pixel circuit PICA includes a light emission control transistor BCT, an initialization transistor IST, a writing transistor SST, a reset transistor RST, a drive transistor DRT, and a heat generation control transistor HST. Some of the transistors may be shared by a plurality of sub-pixels 49 disposed side by side. The light emission control transistor BCT, for example, may be shared by three sub-pixels 49 via common wiring. The reset transistor RST may be provided in the peripheral region GA and be provided to each row of the sub-pixels 49, for example. In this case, the reset transistor RST is coupled to the sources of a plurality of drive transistors DRT via common wiring.

The transistors included in the pixel circuit PICA are n-type TFTs (thin-film transistors). The present embodiment is not limited thereto, and the transistors may be p-type TFTs. To use p-type TFTs, the coupling form of power supply potential, capacitance Cs1, and capacitance Cs2 may be appropriately adapted.

The light emission control scanning line BG is coupled to the gate of the light emission control transistor BCT. The initialization control scanning line IG is coupled to the gate of the initialization transistor IST. The writing control scanning line SG is coupled to the gate of the writing transistor SST. The reset control scanning line RG is coupled to the gate of the reset transistor RST. The heat generation control scanning line HG is coupled to the gate of the heat generation control transistor HST.

The light emission control scanning line BG, the initialization control scanning line IG, the writing control scanning line SG, the reset control scanning line RG, and the heat generation control scanning line HG are coupled to the drive circuits 12 (refer to FIG. 1) provided in the peripheral region GA. The drive circuits 12 supply light emission control signals Vbg, initialization control signals Vig, writing control signals Vsg, reset control signals Vrg, and heat generation control signals Vhg to the light emission control scanning line BG, the initialization control scanning line IG, the writing control scanning line SG, the reset control scanning line RG, and the heat generation control scanning line HG, respectively.

The drive IC 210 (refer to FIG. 1) supplies video signals Vsig to the respective pixel circuits PICA of the first sub-pixel 49R, the second sub-pixel 49G, and the third sub-pixel 49B in a time-division manner. A switching circuit, such as a multiplexer, is provided between each row of the first sub-pixels 49R, the second sub-pixels 49G, and the third sub-pixels 49B and the drive IC 210. The video signals Vsig are supplied to the writing transistor SST via a video signal line L2. The drive IC 210 supplies reset power supply potential Vrst to the reset transistor RST via a reset signal line L3. The drive IC 210 supplies initialization potential Vini to the initialization transistor IST via an initialization signal line L4.

The light emission control transistor BCT, the initialization transistor IST, the writing transistor SST, the reset transistor RST, and the heat generation control transistor HST each function as a switching element that selects electrical continuity and discontinuity between two nodes. The drive transistor DRT functions as an electric current control element that controls an electric current flowing through the first light emitting element 31 based on voltage between the gate and the drain.

The cathode of the first light emitting element 31 is coupled to a cathode power supply line L10 (second power supply line). The anode of the first light emitting element 31 is coupled to an anode power supply line L1 (first power supply line) via the drive transistor DRT and the light emission control transistor BCT. The anode power supply line L1 is supplied with an anode power supply potential PVDD (first potential). In other words, the anode power supply line L1 supplies the anode power supply potential PVDD to the first light emitting element 31 via the anode electrode 23. The cathode power supply line L10 is supplied with a cathode power supply potential PVSS (third potential). The anode power supply potential PVDD is higher than the cathode power supply potential PVSS. The cathode power supply line L10 includes the cathode wiring 60. The light emission operation performed by the first light emitting element 31 and the second light emitting element 32 will be described later.

The anode of the second light emitting element 32 is electrically coupled to the anode power supply line L1 via the heat generation control transistor HST. An anode terminal 38 of the second light emitting element 32 is supplied with the anode power supply potential PVDD. The cathode of the second light emitting element 32 is electrically coupled to the anode electrode 23 and is electrically coupled to the reset transistor RST via the anode electrode 23. A cathode terminal 37 of the second light emitting element 32 is supplied with a reset power supply potential Vrst (second potential) having an electric potential lower than the anode power supply potential PVDD.

The pixel circuit PICA includes the capacitance Cs1 and the capacitance Cs2. The capacitance Cs1 is a holding capacitance formed between the gate and the source of the drive transistor DRT. The capacitance Cs2 is additional capacitance formed between the cathode power supply line L10 and both the source of the drive transistor DRT and the anode of the first light emitting element 31.

Figure 4:
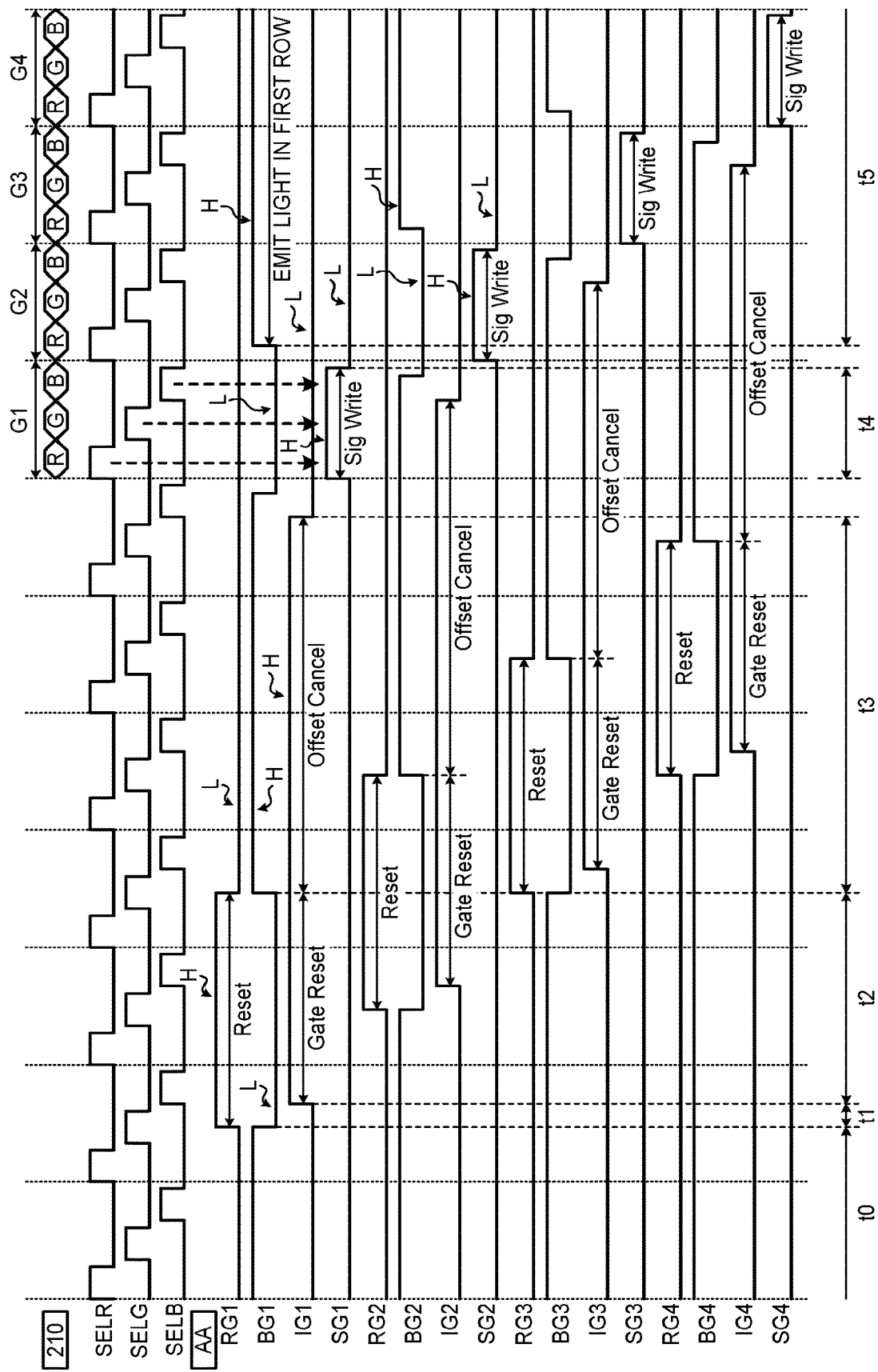
FIG. 4 is a timing chart of an exemplary operation performed by the display device.

FIG. 4 is a timing chart of exemplary operations of the display device. Periods G1 to G4 illustrated in FIG. 4 each correspond to one horizontal period. While FIG. 4 illustrates the operations for driving the sub-pixels 49 of the first row to the sub-pixels 49 of the fourth row, the sub-pixels 49 of the fifth row to the sub-pixels 49 of the last row are subsequently driven. In the following description, a frame period 1F indicates the period for driving the sub-pixels 49 of the first row to the sub-pixels 49 of the last row.

The following describes in detail an exemplary operation from a period t0 to a period t5 illustrated in FIG. 4 using the sub-pixels 49 of the first row as an example. The period t0 is a previous frame light emission period. In other words, the sub-pixels 49 maintain the light emission state of the previous frame in the period t0 when the processing in a certain frame period 1F is yet to be started.

The subsequent period t1 is a source initialization period for the drive transistor DRT. Specifically, in the period t1, the electric potential of a light emission control scanning line BG1 is switched to an L (low) level, and the electric potential of a reset control scanning line RG1 is switched to an H (High) level by the control signals supplied from the drive circuits 12. As a result, the light emission control transistor BCT is turned off (electrically discontinuous state), and the reset transistor RST is turned on (electrically continuous state).

The light emission control scanning line BG1 indicates the light emission control scanning line BG coupled to the sub-pixels 49 of the first row. A light emission control scanning line BG2 indicates the light emission control scanning line BG coupled to the sub-pixels 49 of the second row. A light emission control scanning line BG3 indicates the light emission control scanning line BG coupled to the sub-pixels 49 of the third row. A light emission control scanning line BG4 indicates the light emission control scanning line BG coupled to the sub-pixels 49 of the fourth row. Similarly, other scanning lines, such as the reset control scanning lines RG1, RG2, RG3, and RG4, indicate the scanning lines of the respective rows.

In the period t1, an electric current from the anode power source line L1 is cut off by the light emission control transistor BCT in the sub-pixels 49 of the first row. Light emission from the first light emitting elements 31 stops, and residual electric charges in the sub-pixels 49 flow outside through the reset transistor RST. As a result, the electric potential of the source of the drive transistor DRT is fixed to the reset power supply potential Vrst. The reset power supply potential Vrst is set to have a predetermined potential difference with respect to the cathode power supply potential PVSS. In this case, the potential difference between the reset power supply potential Vrst and the cathode power supply potential PVSS is smaller than the potential difference at which the first light emitting element 31 starts to emit light.

The subsequent period t2 is a gate initialization period for the drive transistor DRT. Specifically, in the period t2, the electric potential of an initialization control scanning line IG1 is switched to the H level by the control signals supplied from the drive circuits 12. The initialization transistor IST is turned on. In the sub-pixels 49 belonging to the first row, the electric potential of the gate of the drive transistor DRT is fixed to the initialization potential Vini by the initialization transistor IST. The initialization potential Vini has an electric potential higher than a threshold of the drive transistor DRT with respect to the reset power supply potential Vrst. As a result, the drive transistor DRT is turned on. In the period t2, no electric current flows through the drive transistor DRT because the light emission control transistor BCT remains off.

The subsequent period t3 is an offset cancel operation period. Specifically, in the period t3, the electric potential of the light emission control scanning line BG1 is switched to the H level, and the electric potential of the reset control scanning line RG1 is switched to the L level by the control signals supplied from the drive circuits 12. As a result, the light emission control transistor BCT is turned on, and the reset transistor RST is turned off.

The drive transistor DRT is in the ON state by the operations performed in the period t2. As a result, an electric current is supplied to the drive transistor DRT from the anode power supply line L1 (anode power supply potential PVDD) via the light emission control transistor BCT.

At this stage, no electric current flows because voltage between the anode and the cathode of the first light emitting element 31 is lower than light emission start voltage. Consequently, the source of the drive transistor DRT is charged by the anode power supply potential PVDD, whereby the electric potential of the source increases. The gate potential of the drive transistor DRT is the initialization potential Vini. When the source potential of the drive transistor DRT is equal to (Vini−Vth), the drive transistor DRT is turned off, and the increase in the electric potential stops. Vth indicates a threshold voltage Vth for the drive transistor DRT.

The threshold voltage Vth varies depending on the sub-pixels 49. Consequently, the source potential of the drive transistor DRT when the increase in the electric potential stops varies depending on the sub-pixels 49. In other words, voltage corresponding to the threshold voltage Vth of the drive transistor DRT is obtained in each of the sub-pixels 49 by the operations performed in the period t3. At this time, the first light emitting element 31 is supplied with a voltage of ((Vini−Vth)−PVSS). No electric current flows through the first light emitting element 31 because this voltage is lower than the light emission start voltage of the first light emitting element 31.

The subsequent period t4 is a video signal writing operation period. Specifically, in the period t4, the electric potential of the light emission control scanning line BG1 is switched to the L level, the electric potential of the initialization control scanning line IG1 is switched to the L level, and the electric potential of a writing control scanning line SG1 is switched to the H level by the control signals supplied from the drive circuits 12.

As a result, the light emission control transistor BCT is turned off, the initialization transistor IST is turned off, and the writing transistor SST is turned on. In the period t4, the video signals Vsig are input to the gate of the drive transistor DRT in the sub-pixels 49 belonging to the first row. The gate potential of the drive transistor DRT changes from the initialization potential Vini to the electric potential of the video signal Vsig. By contrast, the source potential of the drive transistor DRT remains at (Vini−Vth). As a result, the voltage between the gate and the source of the drive transistor DRT is equal to (Vsig−(Vini−Vth)) and reflects variations in the threshold voltage Vth between the sub-pixels 49.

The video signal line L2 extends in the second direction Dy (refer to FIG. 1) and is coupled to the sub-pixels 49 of a plurality of rows belonging to the same column. Consequently, the period t4 for performing the video writing operation is carried out row by row.

The subsequent period t5 is a light emission operation period. Specifically, in the period t5, the electric potential of the light emission control scanning line BG1 is switched to the H level, and the electric potential of the writing control scanning line SG1 is switched to the L level by the control signals supplied from the drive circuits 12. As a result, the light emission control transistor BCT is turned on, and the writing transistor SST is turned off. An electric current is supplied to the drive transistor DRT from the anode power supply line L1 (anode power supply potential PVDD) via the light emission control transistor BCT.

The drive transistor DRT supplies an electric current corresponding to the voltage between the gate and the source set until the period t4 to the first light emitting element 31. The first light emitting element 31 emits light at the luminance corresponding to the electric current. At this time, the voltage between the anode and the cathode of the first light emitting element 31 is a voltage corresponding to the value of the current supplied via the drive transistor DRT. As a result, the electric potential of the anode of the first light emitting element 31 increases. The voltage between the gate and the source of the drive transistor DRT is held by the capacitance Cs1. Consequently, the gate potential of the drive transistor DRT also increases in association with the increase in the electric potential of the anode of the first light emitting element 31 due to coupling of the capacitance Cs1.

In an actual operation, the increase in the gate potential of the drive transistor DRT is slightly smaller than the increase in the electric potential of the anode because additional capacitance, such as the capacitance Cs2, is present in the gate of the drive transistor DRT besides the capacitance Cs1. Because this value is already known, the electric potential of the video signal Vsig can be determined so as to obtain a desired current value in the final voltage between the gate and the source of the drive transistor DRT.

After the operations described above are completed from the first row to the last row, an image of one frame is displayed. The reset operation for the sub-pixels 49 belonging to the second row is performed in a period overlapping the periods t2 and t3. The offset cancel operation for the sub-pixels 49 belonging to the second row is performed in a period overlapping the periods t3 and t4. The video signal writing operation for the sub-pixels 49 belonging to the second row is performed in a period overlapping the period t5. Subsequently, the operations described above are repeated, thereby displaying video.

While the sub-pixels 49 of one row are driven from the period t1 to the period t5 in the exemplary operations illustrated in FIG. 4, the present embodiment is not limited thereto. The drive circuits 12 may simultaneously drive the sub-pixels 49 of two rows or three or more rows.

The configuration of the pixel circuit PICA illustrated in FIG. 3 and the exemplary operations illustrated in FIG. 4 are given by way of example only and may be appropriately modified. The number of wires and the number of transistors in one sub-pixel 49, for example, may be different from those described above. The pixel circuit PICA may have a configuration of a current mirror circuit, for example.

Figure 5:
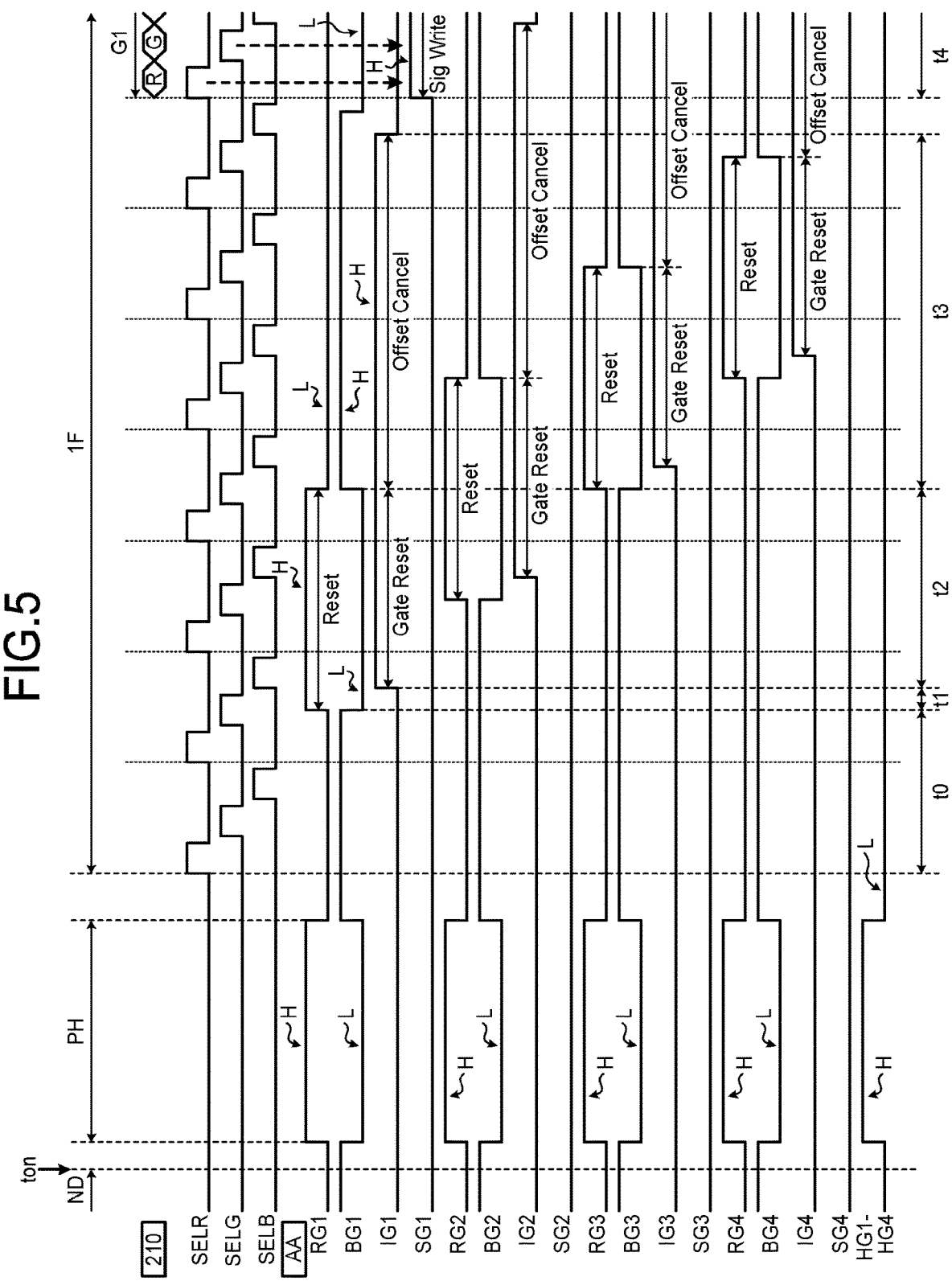
FIG. 5 is a timing chart of an exemplary operation performed by the display device when it starts.

FIG. 5 is a timing chart of an exemplary operation performed by the display device when it starts. As illustrated in FIG. 5, the display device 1 has a preheating period PH between a non-display period ND and the frame period 1F. The non-display period ND is a period when the display device 1 stops displaying an image. The non-display period ND includes a period when the display device 1 is turned off and a period in a sleep mode for stopping display if no input operation is performed for a predetermined period of time, for example.

If the display device 1 is turned on, or an operation for returning from the sleep mode is performed at time ton, the drive IC 210 performs the preheating period PH. Specifically, the electric potential of the reset control scanning lines RG belonging to the respective rows is switched to the H level, the electric potential of the heat generation control scanning lines HG is switched to the H level, and the electric potentials of the light emission control scanning lines BG, the initialization control scanning lines IG, and the writing control scanning lines SG are switched to the L level by various control signals supplied from the drive circuits 12.

As a result, the heat generation control transistor HST and the reset transistor RST are turned on, and the other transistors are turned off. The anode of the second light emitting element 32 is supplied with the anode power supply potential PVDD (first potential) from the anode power supply line L1. The cathode of the second light emitting element 32 is supplied with the reset power supply potential Vrst (second potential) from the reset signal line L3. The anode power supply potential PVDD and the reset power supply potential Vrst are set such that the voltage between the anode and the cathode of the second light emitting element 32 is larger than the light emission start voltage.

As a result, an electric current corresponding to the voltage between the anode and the cathode flows through the second light emitting element 32, thereby causing the second light emitting element 32 to emit light. In the preheating period PH, the anode power supply line L1, the heat generation control transistor HST, the second light emitting element 32, the reset transistor RST, and the reset signal line L3 are electrically coupled to form a current path.

Infrared light output from the second light emitting element 32 heats a resin layer (element insulating film 97 (refer to FIG. 7)) around the second light emitting element 32. An electric current flowing through the second light emitting element 32 raises the temperature of the second light emitting element 32 itself. The heat of the resin layer and the heat generated in the second light emitting element 32 are transmitted to the first light emitting elements 31, thereby raising the temperature of the first light emitting elements 31. The electric potential supplied from the anode power supply line L1 in the preheating period PH may be different from the anode power supply potential PVDD supplied in the frame period 1F. Consequently, the display device 1 can appropriately adjust the electric current flowing through the second light emitting element 32, thereby controlling light emission and heat generation of the second light emitting element 32.

After the electric current is supplied to the second light emitting element 32 for a predetermined period of time, the electric potentials of the reset control scanning lines RG and the heat generation control scanning lines HG belonging to the respective rows are switched to the L level, and the electric potential of the light emission control scanning lines BG is switched to the H level. As a result, supplying the electric current to the second light emitting element 32 stops. Subsequently, the display device 1 performs display in the frame period 1F described above.

In the exemplary operation illustrated in FIG. 5, the second light emitting elements 32 belonging to the sub-pixels 49 of four rows are simultaneously driven in the preheating period PH. The present embodiment is not limited thereto. The drive circuits 12 may simultaneously drive the second light emitting elements 32 belonging to the sub-pixels 49 of three or less or five or more rows. Alternatively, the drive circuits 12 may simultaneously drive all the second light emitting elements 32 belonging to the sub-pixels 49 of the first row to the last row.

Figure 6:
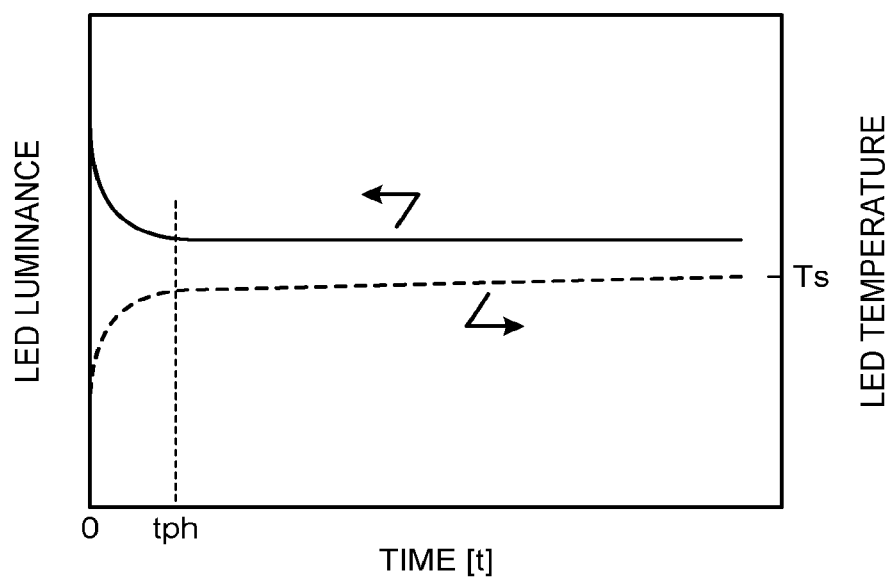
FIG. 6 is a graph schematically illustrating the relation between luminance and temperature of a light emitting element and time according to a comparative example.

FIG. 6 is a graph schematically illustrating the relation between luminance and temperature of the light emitting element and time according to a comparative example. The horizontal axis of the graph illustrated in FIG. 6 indicates time during which an electric current is supplied to the light emitting element 3. Time t=0 indicates the time when supply of an electric current to the light emitting element 3 starts. The vertical axis of the graph illustrated in FIG. 6 indicates luminance and temperature of the light emitting element 3.

As illustrated in FIG. 6, the light emitting element 3 according to the comparative example has the temperature characteristics that the luminous efficacy decreases with a rise in temperature. Specifically, if the temperature of the light emitting element 3 rises in a period from time t=0, when the electric current starts to flow through the light emitting element 3 according to the comparative example, to time tph, the luminance (luminous efficacy) decreases, and the light emission operation becomes unstable. After the time tph, the light emitting element 3 has a constant temperature Ts, and the luminance becomes stable.

In the preheating period PH different from the display period, the second light emitting element 32 according to the present embodiment outputs infrared light, thereby heating the first light emitting elements 31 in advance. In this period, no electric current flows through the first light emitting elements 31. The frame period 1F is started after the temperature of the first light emitting elements 31 rises to temperature Ts illustrated in FIG. 6, for example. With this mechanism, the display device 1 can suppress a rise in temperature of the first light emitting elements 31 when an electric current flows through the first light emitting elements 31 in the period t5 (light emission operation period). In other words, the first light emitting elements 31 start to be supplied with an electric current and driven in a period when the light emission operation is stabilized after the time tph illustrated in FIG. 6. Consequently, the display device 1 can suppress reduction in luminance (luminous efficacy) due to a rise in temperature of the first light emitting elements 31. As a result, the display device 1 can suppress deterioration of display characteristics.

Figure 7:
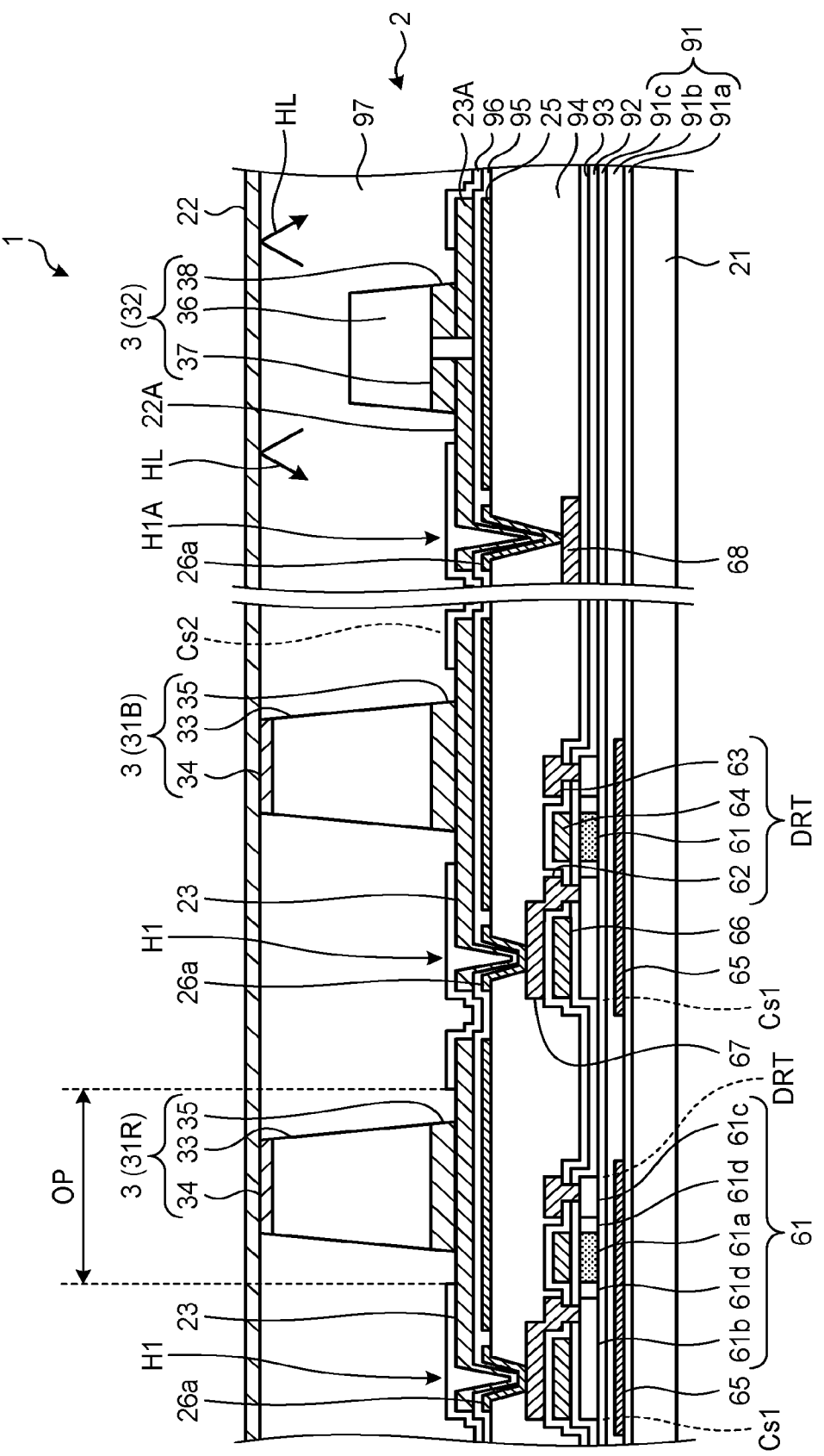
FIG. 7 is a sectional view along line VII-VII' of FIG. 2.
Figure 8:
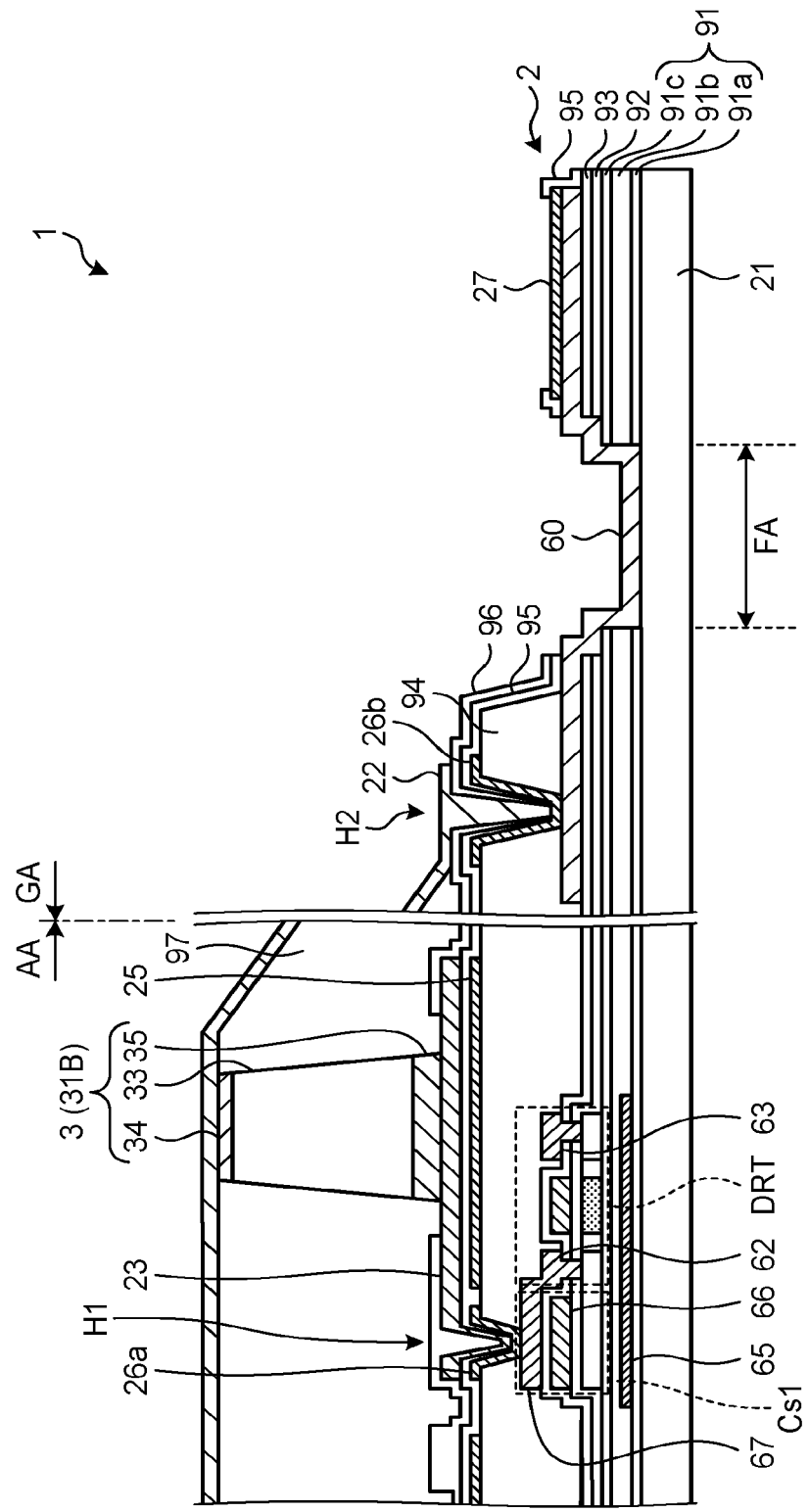
FIG. 8 is a sectional view along line VIII-VIII' of FIG. 1.

The following describes a sectional configuration of the display device 1. FIG. 7 is a sectional view along line VII-VII' of FIG. 2. FIG. 8 is a sectional view along line VIII-VIII' of FIG. 1. As illustrated in FIG. 7, the light emitting elements 3 are provided on the array substrate 2. The array substrate 2 includes the substrate 21, the anode electrode 23, 23A, a counter electrode 25, a coupling electrode 26a, various transistors, various kinds of wiring, and various insulating films.

The substrate 21 is an insulating substrate and is a glass substrate made of quartz or non-alkali glass or a resin substrate made of polyimide, for example. If the substrate 21 is a flexible resin substrate, the display device 1 may be provided as a sheet display. The substrate 21 is not necessarily made of polyimide and may be made of other resin materials.

In the present specification, the direction from the substrate 21 toward the light emitting element 3 in the direction perpendicular to the surface of the substrate 21 is referred to as "upper side" or simply as "on". The direction from the light emitting element 3 toward the substrate 21 is referred to as "lower side" or simply as "under".

An undercoat film 91 is provided on the substrate 21. The undercoat film 91 has a three-layered structure including insulating films 91a, 91b, and 91c, for example. The insulating film 91a is a silicon oxide film, the insulating film 91b is a silicon nitride film, and the insulating film 91c is a silicon oxide film. The lower insulating film 91a is provided to improve adhesion between the substrate 21 and the undercoat film 91. The middle insulating film 91b is provided as a block film that prevents water and impurities from entering from outside. The upper insulating film 91c is provided as a block film that prevents hydrogen atoms contained in the silicon nitride film of the insulating film 91b from diffusing toward a semiconductor layer 61.

The structure of the undercoat film 91 is not limited to that illustrated in FIG. 7. The undercoat film 91 may be a single-layered film or a two-layered film, for example, or may be a multilayered film having four or more layers. If the substrate 21 is a glass substrate, the silicon nitride film may be formed directly on the substrate 21 because silicon nitride films have relatively high adhesion.

A light shielding film 65 is provided on the insulating film 91a. The light shielding film 65 is provided between the semiconductor layer 61 and the substrate 21. The light shielding film 65 can prevent light from entering into a channel region 61a of the semiconductor layer 61 from the substrate 21. Alternatively, the light shielding film 65 may be made of conductive material and supplied with a predetermined electric potential. As a result, the light shielding film 65 may have a back-gate effect on a drive transistor DRT. The light shielding film 65 may be provided on the substrate 21, and the insulating film 91a may be provided covering the light shielding film 65.

The drive transistor DRT is provided on the undercoat film 91. While the drive transistor DRT out of the transistors is illustrated in FIG. 7, the light emission control transistor BCT, the initialization transistor IST, the writing transistor SST, the reset transistor RST, and the heat generation control transistor HST included in the pixel circuit PICA also have the same multilayered structure as that of the drive transistor DRT.

The drive transistor DRT includes the semiconductor layer 61, a source electrode 62, a drain electrode 63, and a gate electrode 64. The semiconductor layer 61 is provided on the undercoat film 91. The semiconductor layer 61 is made of polysilicon, for example. The material of the semiconductor layer 61 is not limited thereto, and the semiconductor layer 61 may be made of a microcrystalline oxide semiconductor, an amorphous oxide semiconductor, or low-temperature polysilicon, for example. While only an n-type TFT is provided as the drive transistor DRT, a p-type TFT may be simultaneously formed. In the n-type TFT, the semiconductor layer 61 includes a channel region 61a, a source region 61b, a drain region 61c, and a low-concentration impurity region 61d. The low-concentration impurity region 61d is provided between the channel region 61a and the source region 61b and between the channel region 61a and the drain region 61c.

A gate insulating film 92 is provided on the undercoat film 91 to cover the semiconductor layer 61. The gate insulating film 92 is a silicon oxide film, for example. The gate electrode 64 is provided on the gate insulating film 92. First wiring 66 is provided in the same layer as the gate electrode 64. The gate electrode 64 and the first wiring 66 are made of molybdenum tungsten (MoW), for example. While the drive transistor DRT in the example illustrated in FIG. 7 has a top-gate structure in which the gate electrode 64 is provided on the semiconductor layer 61, the structure of the drive transistor DRT is not limited thereto. The drive transistor DRT may have a bottom-gate structure in which the gate electrode 64 is provided under the semiconductor layer 61 or a dual-gate structure in which the gate electrodes 64 are provided both on and under the semiconductor layer 61.

An interlayer insulating film 93 is provided on the gate insulating film 92 to cover the gate electrode 64. The interlayer insulating film 93 has a multilayered structure of a silicon nitride film and a silicon oxide film, for example. The source electrode 62 and the drain electrode 63 are provided on the interlayer insulating film 93. The source electrode 62 is coupled to the source region 61b through a contact hole formed in the gate insulating film 92 and the interlayer insulating film 93. The drain electrode 63 is coupled to the drain region 61c through a contact hole formed in the gate insulating film 92 and the interlayer insulating film 93. The source electrode 62 is coupled to second wiring 67 serving as routing wiring. The source electrode 62, the drain electrode 63, and the second wiring 67 may have a three-layered structure of titanium (Ti), aluminum (Al), and titanium (Ti), for example.

Part of the second wiring 67 is provided in a region overlapping the first wiring 66. The first wiring 66 and the second wiring 67 facing each other with the interlayer insulating film 93 interposed therebetween form capacitance Cs1. The first wiring 66 is provided in a region overlapping part of the semiconductor layer 61. The capacitance Cs1 includes capacitance formed by the semiconductor layer 61 and the first wiring 66 facing each other with the gate insulating film 92 interposed therebetween.

A flattening film 94 is provided on the interlayer insulating film 93 to cover the drive transistor DRT and the second wiring 67. The flattening film 94 is made of organic material, such as photosensitive acrylic. Organic material, such as photosensitive acrylic, is excellent in coverage property for difference in level of wiring and surface flatness compared with inorganic insulating material formed by CVD, for example.

The counter electrode 25, a capacitance insulating film 95, the anode electrode 23, 23A, and an anode electrode insulating film 96 are layered in order on the flattening film 94. The counter electrode 25 is made of translucent conductive material, such as indium tin oxide (ITO). The coupling electrode 26a is provided in the same layer as the counter electrode 25. The coupling electrode 26a is provided covering the inside of a contact hole H1 formed in the flattening film 94 and is coupled to the second wiring 67 at the bottom of the contact hole H1.

The capacitance insulating film 95 is provided covering the counter electrode 25 and the coupling electrode 26a and has an opening in a region overlapping the contact hole H1. The capacitance insulating film 95 is a silicon nitride film, for example. The anode electrode 23 faces the counter electrode 25 with the capacitance insulating film 95 interposed therebetween. The anode electrode 23 is electrically coupled to the coupling electrode 26a and the second wiring 67 through the contact hole H1. As a result, the anode electrode 23 is electrically coupled to the drive transistor DRT. The anode electrode 23 has a multilayered structure of Mo and Al. The material of the anode electrode 23 is not limited thereto, and the anode electrode 23 may be made of material including at least one of metals of Mo and Ti. Alternatively, the anode electrode 23 may be made of alloy including at least one of Mo and Ti or translucent conductive material.

Capacitance Cs2 is formed between the anode electrode 23 and the counter electrode 25 facing each other with the capacitance insulating film 95 interposed therebetween. The counter electrode 25 made of ITO also serves as a barrier film that protects various kinds of wiring, such as the second wiring 67, in forming the anode electrode 23. In patterning the anode electrode 23, the counter electrode 25 is partially exposed to etching environment. By annealing performed between formation of the counter electrode 25 and formation of the anode electrode 23, the counter electrode 25 has sufficient resistance to etching for the anode electrode 23.

The anode electrode insulating film 96 is provided to cover the anode electrode 23. The anode electrode insulating film 96 is a silicon nitride film, for example. The anode electrode insulating film 96 covers the periphery of the anode electrode 23 and insulates the anode electrodes 23 of the sub-pixels 49 disposed side by side.

The anode electrode insulating film 96 has an opening OP for mounting the first light emitting element 31 at a position overlapping the anode electrode 23. The size of the opening OP is larger than the area of the first light emitting element 31 considering the amount of mounting misalignment in the process of mounting the first light emitting element 31, for example. In other words, the area of the anode electrode 23 is larger than that of the first light emitting element 31 in planar view seen from the direction perpendicular to the substrate 21. The first light emitting element 31 includes at least two terminals (anode terminal 35 and cathode terminal 34). The area of the anode electrode 23 is larger than that of at least one of the two terminals (the anode terminal 35 and the cathode terminal 34) in planar view seen from the direction perpendicular to the substrate 21. If the mounting area of the light emitting element 3 is approximately 10 µm×10 µm in planar view, for example, the area of the opening OP is preferably secured to be approximately 20 µm×20 µm.

The first light emitting elements 31 (31R, 31G, and 31B) are each mounted on the corresponding anode electrode 23. The anode electrode 23 is electrically coupled to the anode electrode 23 of the first light emitting element 31. The first light emitting element 31 includes a semiconductor layer 33, the cathode terminal 34, and the anode terminal 35. The semiconductor layer 33 has a multilayered structure of an n-type cladding layer, an active layer, and a p-type cladding layer. In the first light emitting element 31, the anode terminal 35 faces downward (toward the substrate 21), and the cathode terminal 34 faces upward (toward the cathode electrode 22).

The semiconductor layer 33 is made of a compound semiconductor, such as gallium nitride (GaN) and aluminum indium phosphorous (AlInP). The semiconductor layer 33 may be made of different materials depending on the first light emitting elements 31R, 31G, and 31B. The active layer may have a multi-quantum well structure (MQW structure) in which well layers and barrier layers composed of several atomic layers are cyclically layered for high efficiency. In the first light emitting element 31, the semiconductor layer 33 may be provided on a semiconductor substrate. The first light emitting element 31 is not necessarily mounted alone on the array substrate 2, and an LED chip including the first light emitting element 31 may be mounted on the array substrate 2. The LED chip includes a light emitting element substrate, the first light emitting element 31 provided to the light emitting element substrate, and a circuit element group provided to the light emitting element substrate and configured to drive the light emitting element 3, for example. The light emitting element substrate, the light emitting element 3, and the circuit element group are integrated in one chip.

In the region provided with the second light emitting element 32, a cathode electrode 22A and the anode electrode 23A are separated from each other on the capacitance insulating film 95. The anode electrode insulating film 96 is provided covering the cathode electrode 22A and the anode electrode 23A and has an opening at a part on which the second light emitting element 32 is mounted. The cathode electrode 22A is coupled to third wiring 68 provided on the interlayer insulating film 93 through a contact hole H1A. The anode electrode 23A is electrically coupled to the heat generation control transistor HST.

The second light emitting element 32 includes a semiconductor layer 36, the cathode terminal 37, and the anode terminal 38. Both the cathode terminal 37 and the anode terminal 38 of the second light emitting element 32 face downward (toward the substrate 21) and are mounted on the cathode electrode 22A and the anode electrode 23A, respectively. The semiconductor layer 36 is made of GaAlAs/GaAs or GaAsP/GaAs, for example.

The element insulating film 97 is provided between a plurality of light emitting elements 3 (a plurality of first light emitting elements 31 and a plurality of second light emitting elements 32). The element insulating film 97 is made of resin material. The element insulating film 97 covers the side surfaces of the first light emitting elements 31. The cathode terminal 34 of the first light emitting element 31 is exposed from the element insulating film 97. The element insulating film 97 is flattened such that the upper surface of the element insulating film 97 and the upper surfaces of the cathode terminals 34 form the same plane. The position of the upper surface of the element insulating film 97 may be different from that of the upper surfaces of the cathode terminals 34.

The element insulating film 97 covers the side surfaces and the upper surfaces of the second light emitting elements 32.

The cathode electrode 22 covers a plurality of light emitting elements 3 and the element insulating film 97 and is electrically coupled to a plurality of first light emitting elements 31. More specifically, the cathode electrode 22 is provided over the upper surface of the element insulating film 97 and the upper surfaces of the cathode terminals 34. The cathode electrode 22 is electrically coupled to the cathode terminals 34 of the first light emitting elements 31 of the pixels Pix mounted on the display region AA. The element insulating film 97 and the cathode electrode 22 are layered in order on the second light emitting elements 32. In other words, the second light emitting elements 32 are not coupled to the cathode electrode 22.

The cathode electrode 22 is made of translucent conductive material, such as ITO. With this structure, the cathode electrode 22 can efficiently extract light output from the first light emitting elements 31 to the outside. At least part of heating infrared light HL output from the second light emitting elements 32 is reflected by the cathode electrode 22 and travels in the element insulating film 97. As a result, the infrared light HL can be efficiently absorbed by the element insulating film 97, thereby satisfactorily heating the element insulating film 97. At least part of the infrared light HL travels in the element insulating film 97 and reaches the first light emitting elements 31 disposed side by side with the second light emitting elements 32. As a result, the first light emitting elements 31 are heated.

As illustrated in FIG. 8, the cathode electrode 22 is coupled to the cathode wiring 60 provided on the array substrate 2 via a cathode contact part (contact hole H2) formed outside the display region AA. FIG. 8 illustrates both the peripheral region GA and the display region AA to facilitate the reader's understanding the correspondence relation between the sectional configuration of the peripheral region GA and the sectional configuration of the display region AA.

As illustrated in FIG. 8, the display device 1 includes a terminal part 27, a bending region FA, and the cathode contact part (contact hole H2) in the peripheral region GA. The terminal part 27 is a terminal coupled to the drive IC 210 or a wiring substrate, such as a flexible printed circuit board. The bending region FA is a region for bending the peripheral region GA closer to the terminal part 27 on the array substrate 2. To provide the bending region FA, the substrate 21 is made of resin material having flexibility.

Specifically, the undercoat film 91, the gate insulating film 92, and the interlayer insulating film 93 extend to the end of the substrate 21 from the display region AA to the peripheral region GA. The undercoat film 91, the gate insulating film 92, and the interlayer insulating film 93 are removed in the bending region FA. The undercoat film 91, the gate insulating film 92, and the interlayer insulating film 93 are removed by etching in the bending region FA. In this case, the surface of the substrate 21 made of resin material, such as polyimide, may possibly be partially eroded and have a recess.

The cathode wiring 60 is provided on the interlayer insulating film 93. In other words, the cathode wiring 60 is provided in the same layer and is made of the same material as that of the source electrode 62, the drain electrode 63, and the second wiring 67. The cathode wiring 60 is provided over the bending region FA along the steps formed by the undercoat film 91, the gate insulating film 92, the interlayer insulating film 93, and the substrate 21. The cathode wiring 60 is provided on the substrate 21 in the bending region FA and on the interlayer insulating film 93 between the bending region FA and the substrate 21.

The flattening film 94 is removed in the bending region FA and a region between the bending region FA and the end of the substrate 21 in the peripheral region GA. The flattening film 94 has the contact hole H2 in a region between the bending region FA and the display region AA. The cathode wiring 60 is exposed at the bottom surface of the contact hole H2, and the thickness of the element insulating film 97 becomes thinner from the periphery of the display region AA toward the peripheral region GA. The cathode electrode 22 is electrically coupled to the cathode wiring 60 via a coupling electrode 26b provided in the contact hole H2. The coupling electrode 26b is provided in the same layer as that of the counter electrode 25 and the coupling electrode 26a, and is made of the same material as that of the counter electrode 25 and the coupling electrode 26a.

The terminal part 27 is provided on the cathode wiring 60 in a region between the bending region FA and the end of the substrate 21. The capacitance insulating film 95 is provided to cover the terminal part 27 and has an opening in a region overlapping the terminal part 27.

As described above, the display device 1 with the light emitting elements 3 serving as display elements is provided. The display device 1 may include a cover glass, a touch panel, and other components on the cathode electrode 22 as needed. In this case, a filler made of resin or the like may be provided between the display device 1 and the member, such as a cover glass. The display device 1 does not necessarily have a face-up structure in which the upper part of the first light emitting element 31 is coupled to the cathode electrode 22. The display device 1 may have what is called a face-down structure in which the lower part of the first light emitting element 31 is coupled to the anode electrode 23 and the cathode electrode 22.

Figure 9:
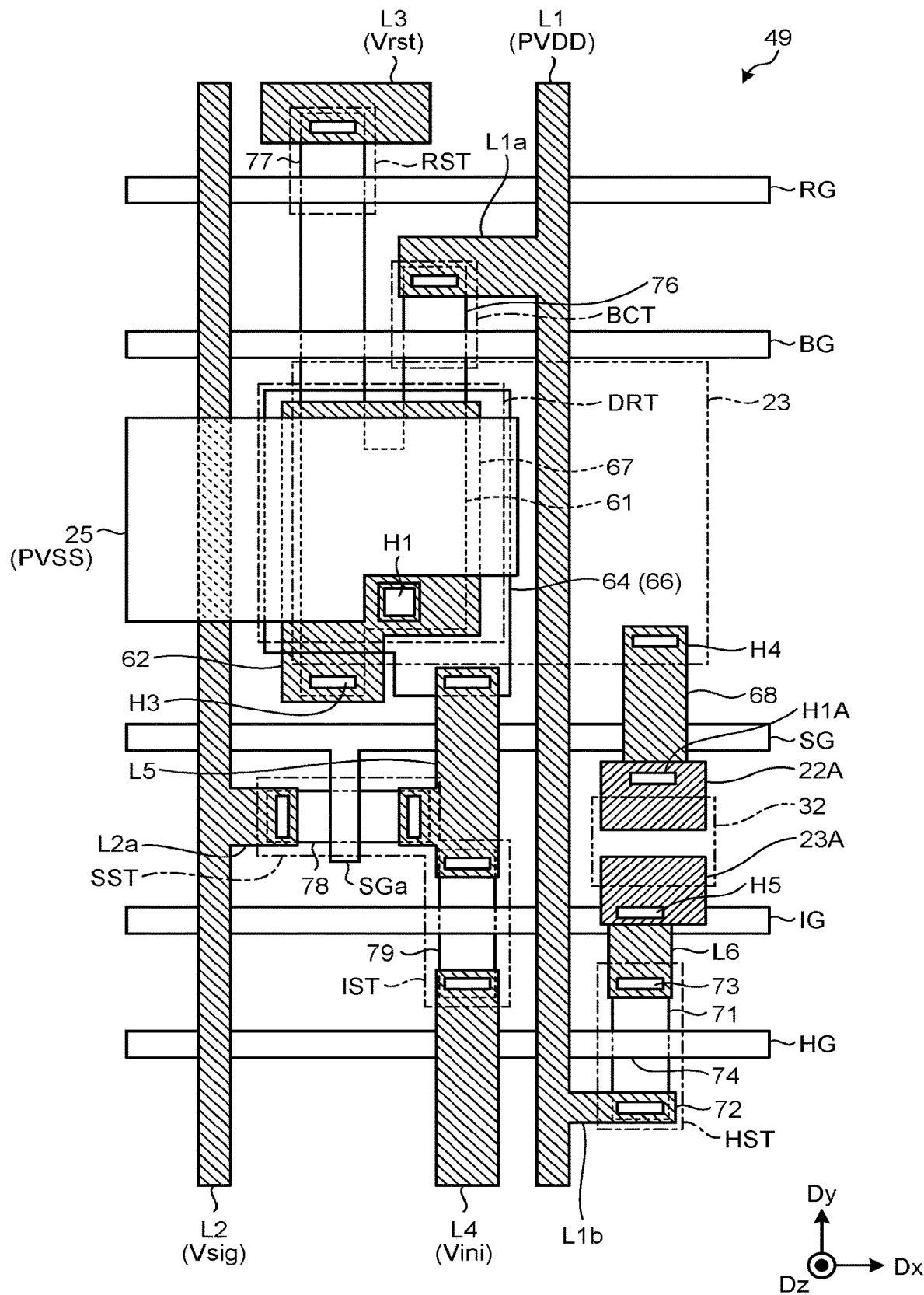
FIG. 9 is an enlarged plan view of one sub-pixel of the display device according to the first embodiment.

The following describes the configuration of the sub-pixel 49 and the second light emitting element 32 in greater detail. FIG. 9 is an enlarged plan view of one sub-pixel of the display device according to the first embodiment. To simplify the drawing, FIG. 9 does not illustrate the first light emitting element 31 and illustrates the second light emitting element with an alternate long and two short dashes line. In FIG. 9, the anode electrode 23 is represented by an alternate long and two short dashes line, and the anode power supply line L1, the video signal line L2, the reset signal line L3, the initialization signal line L4, and coupling wiring L5 and L6 are hatched.

As illustrated in FIG. 9, the anode power supply line L1, the video signal line L2, and the initialization signal line L4 extend in the second direction Dy. The reset signal line L3 is provided between the anode power supply line L1 and the video signal line L2. While the reset signal line L3 is simply illustrated to simplify the drawing, it extends in the second direction Dy like the anode power supply line L1 and other lines.

The reset control scanning line RG, the light emission control scanning line BG, the writing control scanning line SG, the initialization control scanning line IG, and the heat generation control scanning line HG extend in the first direction Dx and intersect the anode power supply line L1 and the video signal line L2 in planar view. The coupling wiring L5 couples the drive transistor DRT, the initialization transistor IST, and the writing transistor SST. The coupling wiring L6 couples the second light emitting element 32 and the heat generation control transistor HST.

The semiconductor layer 61, the source electrode 62 (second wiring 67), and the gate electrode 64 (first wiring 66) constituting the drive transistor DRT are provided in a region surrounded by the anode power supply line L1, the video signal line L2, the light emission control scanning line BG, and the writing control scanning line SG. The semiconductor layer 61 is coupled to the source electrode (second wiring 67) through a contact hole H3 at a part not overlapping the gate electrode 64 (first wiring 66). The anode electrode 23 and the counter electrode 25 are provided in a region overlapping the drive transistor DRT. The counter electrode 25 is coupled to the cathode power supply line L10 and is supplied with the cathode power supply potential PVSS. With this configuration, the counter electrode 25 can shield the anode electrode 23 and the light emitting element 3 from the transistors and the various kinds of wiring on the array substrate 2.

The anode electrode 23 extends to a region not overlapping the drive transistor DRT and is partially coupled to a first end of the third wiring 68 through a contact hole H4. A second end of the third wiring 68 is electrically coupled to the second light emitting element 32 via the cathode electrode 22A. The anode electrode 23A coupled to the second light emitting element 32 is coupled to the coupling wiring L6 through a contact hole H5.

The heat generation control transistor HST includes a semiconductor layer 71, a source electrode 72, a drain electrode 73, and a gate electrode 74. The semiconductor layer 71 extends in the second direction Dy and intersects the heat generation control scanning line HG in planar view. The region of the semiconductor layer 71 overlapping the heat generation control scanning line HG serves as a channel region. The part of the heat generation control scanning line HG overlapping the semiconductor layer 71 functions as the gate electrode 74 of the heat generation control transistor HST. One end of the semiconductor layer 71 is coupled to an anode power supply line coupling part L1b. The other end of the semiconductor layer 71 is coupled to the coupling wiring L6. The anode power supply line coupling part L1b is a part branched off from the anode power supply line L1 in the first direction Dx. Part of the anode power supply line coupling part L1b and part of the coupling wiring L6 function as the source electrode 72 and the drain electrode 73, respectively.

With this configuration, the cathode terminal 37 of the second light emitting element 32 is electrically coupled to the anode electrode 23. The anode terminal 38 of the second light emitting element 32 is electrically coupled to the anode power supply line L1 via the heat generation control transistor HST.

The light emission control transistor BCT includes a semiconductor layer 76. The semiconductor layer 76 is coupled to the semiconductor layer 61 of the drive transistor DRT and intersects the light emission control scanning line BG in planar view. One end of the semiconductor layer 76 is electrically coupled to an anode power supply line coupling part L1a. The anode power supply line coupling part L1a is a part branched off from the anode power supply line L1 in the first direction Dx. With this configuration, the drive transistor DRT and the light emission control transistor BCT are electrically coupled to the anode power supply line L1.

The reset transistor RST includes a semiconductor layer 77. One end of the semiconductor layer 77 is coupled to the reset signal line L3, and the other end of the semiconductor layer 77 is coupled to the semiconductor layer 61 of the drive transistor DRT. The semiconductor layer 77 extends in the second direction Dy and intersects the light emission control scanning line BG and the reset control scanning line RG in planar view. The part of the semiconductor layer 77 overlapping the reset control scanning line RG serves as a channel region.

The semiconductor layer 77 and the semiconductor layer 76 are coupled to the semiconductor layer 61, thereby constructing the coupling configuration of the drive transistor DRT, the light emission control transistor BCT, and the reset transistor RST illustrated in the circuit diagram illustrated in FIG. 3.

The writing transistor SST includes a semiconductor layer 78. One end of the semiconductor layer 78 is coupled to a video signal line coupling part L2a. The video signal line coupling part L2a is a part branched off from the video signal line L2 in the first direction Dx. The other end of the semiconductor layer 78 is coupled to the coupling wiring L5. The semiconductor layer 78 extends in the first direction Dx and intersects a branch SGa in planar view. The branch SGa is a part branched off from the writing control scanning line SG in the second direction Dy.

The initialization transistor IST includes a semiconductor layer 79. One end of the semiconductor layer 79 is coupled to the initialization signal line L4. The other end of the semiconductor layer 79 is coupled to the coupling wiring L5. The semiconductor layer 79 extends in the second direction Dy and intersects the initialization control scanning line IG in planar view.

As described above, the second light emitting element 32 is provided near the first light emitting element 31 in one sub-pixel 49. With this configuration, the first light emitting element 31 is efficiently heated by the infrared light HL output from the second light emitting element 32. The second light emitting element 32 is electrically coupled to the anode power supply line L1 and the reset signal line L3 for driving the first light emitting element 31. The second light emitting element 32 and the first light emitting element 31 share the anode power supply line L1 and the reset signal line L3. This configuration can reduce the size of the circuit compared with a case where a circuit that drives the second light emitting element 32 is independently provided.

The position of the second light emitting element 32 illustrated in FIG. 9 is given by way of example only and can be appropriately modified. While the second light emitting element 32 is coupled to the anode power supply line L1, for example, the present embodiment is not limited thereto. Another power supply line for driving the second light emitting element 32 may be provided independently of the anode power supply line L1. The cathode of the second light emitting element 32 is not necessarily electrically coupled to the reset signal line L3 and may be coupled to the cathode power supply line L10.

Second Embodiment

Figure 10:
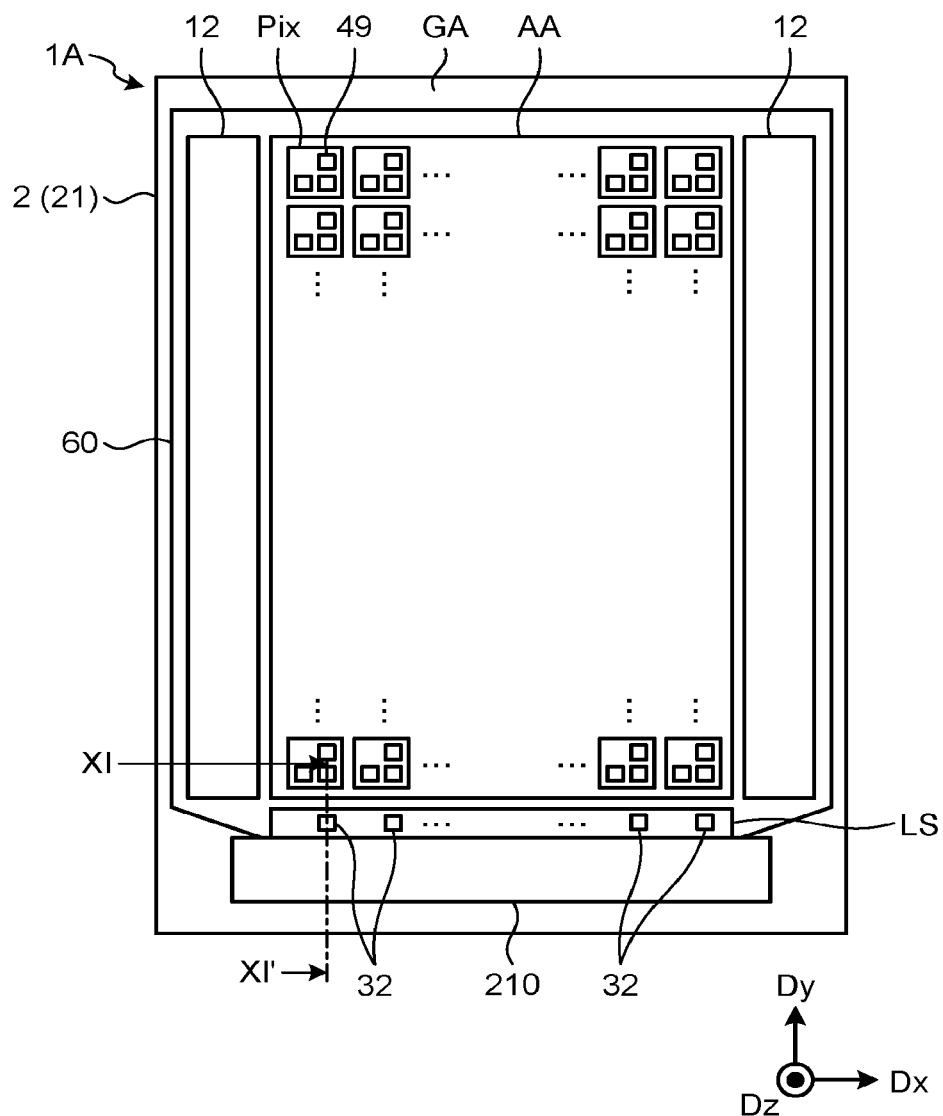
FIG. 10 is a plan view schematically illustrating the display device according to a second embodiment.

FIG. 10 is a plan view schematically illustrating the display device according to a second embodiment. In the following description, the same components as those described in the embodiment above are denoted by like reference numerals, and overlapping explanation thereof is omitted.

As illustrated in FIG. 10, a display device 1A according to the second embodiment includes a plurality of second light emitting elements 32 in the peripheral region GA of the substrate 21. Specifically, the second light emitting elements 32 are arrayed in the first direction Dx along one side of the display region AA in a region LS between the display region AA and the drive IC 210. The heat generation control transistors HST according to the present embodiment are provided in the region LS corresponding to the second light emitting elements 32. In other words, the pixels Pix in the display region AA are not provided with the second light emitting elements 32. Each pixel circuit PICA does not include the heat generation control transistor HST. Consequently, the second embodiment can display images in higher definition than the first embodiment.

Figure 11:
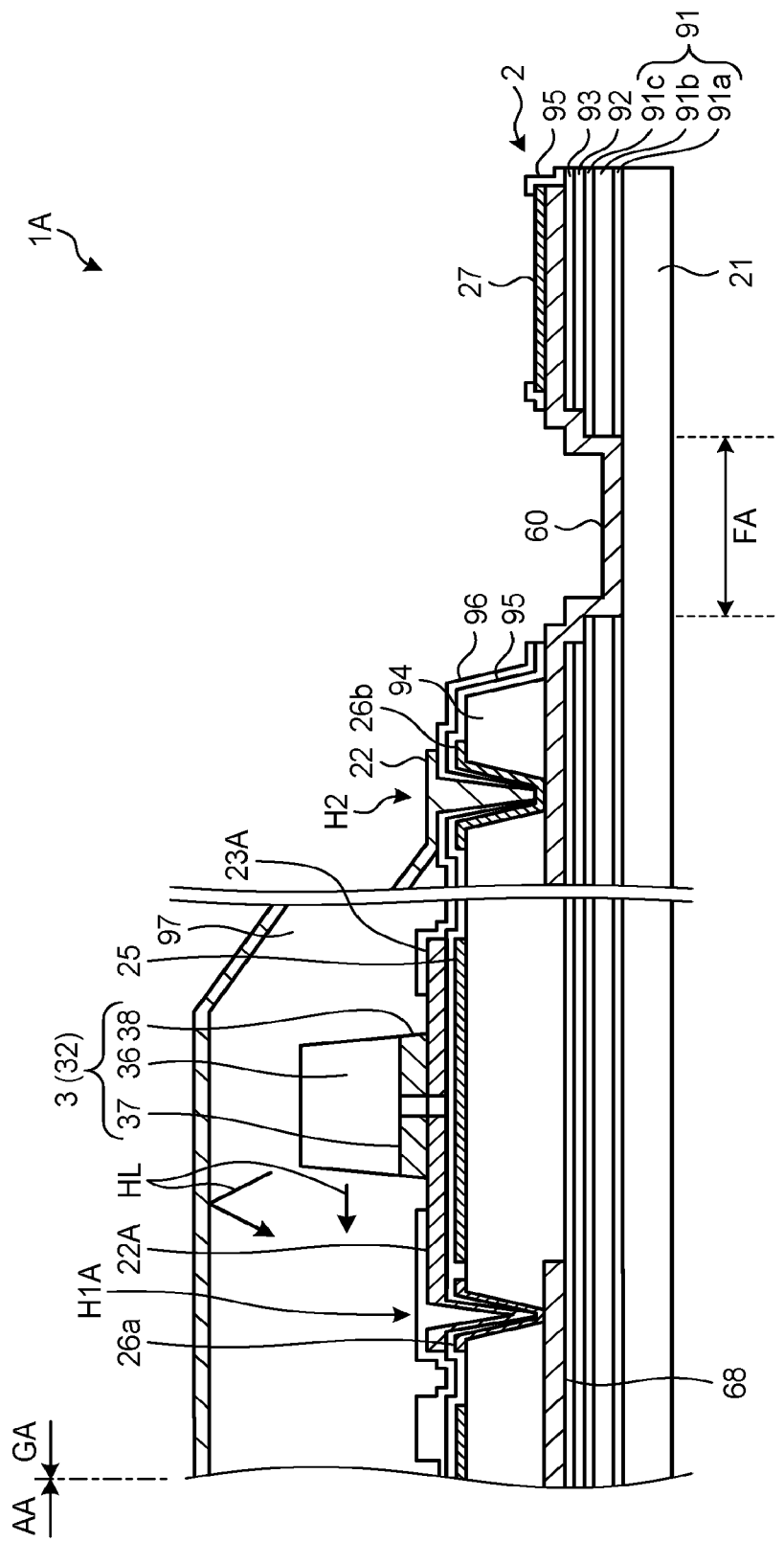
FIG. 11 is a sectional view along line XI-XI' of FIG. 10.

FIG. 11 is a sectional view along line XI-XI' of FIG. 10. As illustrated in FIG. 11, the second light emitting elements 32 are disposed between a plurality of terminal parts 27 and the display region AA. In the peripheral region GA, the element insulating film 97 and the cathode electrode 22 are provided covering the second light emitting elements 32. With this configuration, the infrared light HL output from the second light emitting elements 32 is reflected by the cathode electrode 22 and travels in the element insulating film 97 toward the display region AA. As a result, the element insulating film 97 is heated, thereby heating the first light emitting elements 31 in the display region AA. Alternatively, the infrared light HL that reaches the first light emitting elements 31 heats the first light emitting elements 31.

While the second light emitting elements 32 according to the second embodiment are provided in the region LS extending along one side of the display region AA, the present embodiment is not limited thereto. The second light emitting elements 32 may be provided in the peripheral region GA provided with the drive circuits 12 or in the peripheral region GA opposite to the region LS across the display region AA. The second light emitting elements 32 may be provided along two or more sides of the display region AA. The configuration of the second embodiment may be combined with that of the first embodiment.

Third Embodiment

Figure 12:
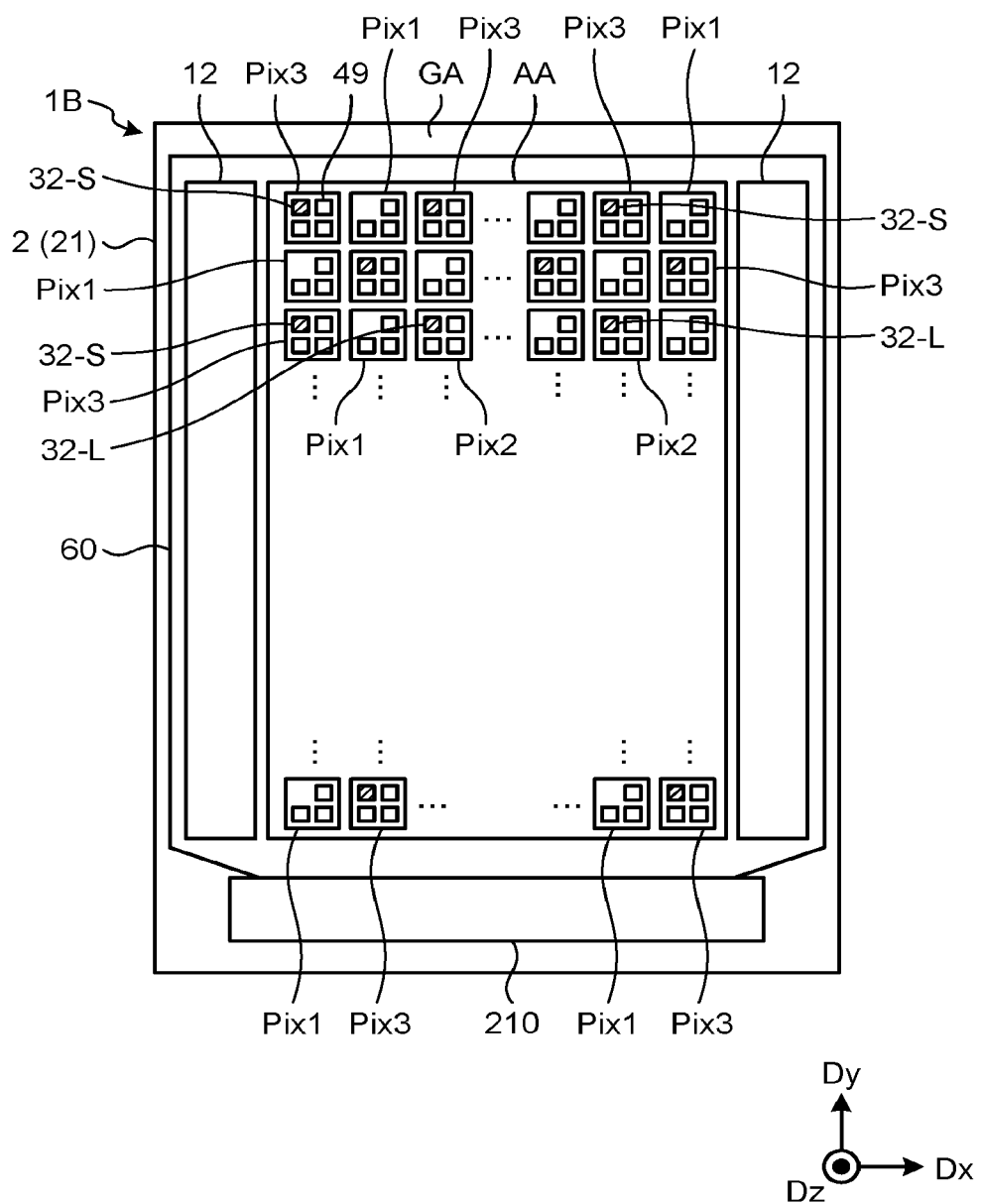
FIG. 12 is a plan view schematically illustrating the display device according to a third embodiment.

FIG. 12 is a plan view schematically illustrating the display device according to a third embodiment. As illustrated in FIG. 12, the second light emitting elements 32 include second light emitting elements 32-L for light source and second light emitting elements 32-S for detection in a display device 1B according to the third embodiment. The second light emitting elements 32-L for light source and the second light emitting elements 32-S for detection have the same structure as that of the second light emitting elements 32 according to the first and the second embodiments. The second light emitting element 32-L for light source is driven in forward bias, thereby outputting infrared light. The second light emitting element 32-S for detection is driven in reverse bias, thereby outputting signals corresponding to received infrared light. In other words, the second light emitting element 32-S for detection functions as an optical sensor.

The pixels Pix include first pixels Pix1, second pixels Pix2, and third pixels Pix3. The first pixel Pix1 includes a plurality of first light emitting elements 31 and does not include the second light emitting element 32 (the second light emitting element 32-L for light source or the second light emitting element 32-S for detection). The second pixel Pix2 includes a plurality of first light emitting elements 31 and one second light emitting element 32-L for light source. The third pixel Pix3 includes a plurality of first light emitting elements 31 and one second light emitting element 32-S for detection.

The first pixels Pix1, the second pixels Pix2, and the third pixels Pix3 are alternately arrayed in the display region AA. In the first pixel row, for example, the first pixels Pix1 and the third pixels Pix3 are alternately arrayed in the first direction Dx. In the second pixel row, the positions of the first pixels Pix1 and the third pixels Pix3 are switched with respect to the first pixel row, and the first pixels Pix1 and the third pixels Pix3 are alternately arrayed in the first direction Dx. In other words, the first pixels Pix1 and the third pixels Pix3 are alternately arrayed in the second direction Dy.

In the third pixel row, the first pixels Pix1, the second pixels Pix2, and the third pixels Pix3 are alternately arrayed in the first direction Dx. One second pixel Pix2 is provided corresponding to a plurality of pixels Pix. The numbers of the first pixels Pix1 and the third pixels Pix3 out of the pixels Pix are larger than the number of the second pixels Pix2. This configuration has a larger ratio of the second light emitting elements 32-S for detection to the second light emitting elements 32-L for light source than in a case where the first pixels Pix1, the second pixels Pix2, and the third pixels Pix3 are evenly arrayed. Consequently, the present embodiment can increase the detection sensitivity of the second light emitting elements 32-S for detection as a whole.

Figure 13:
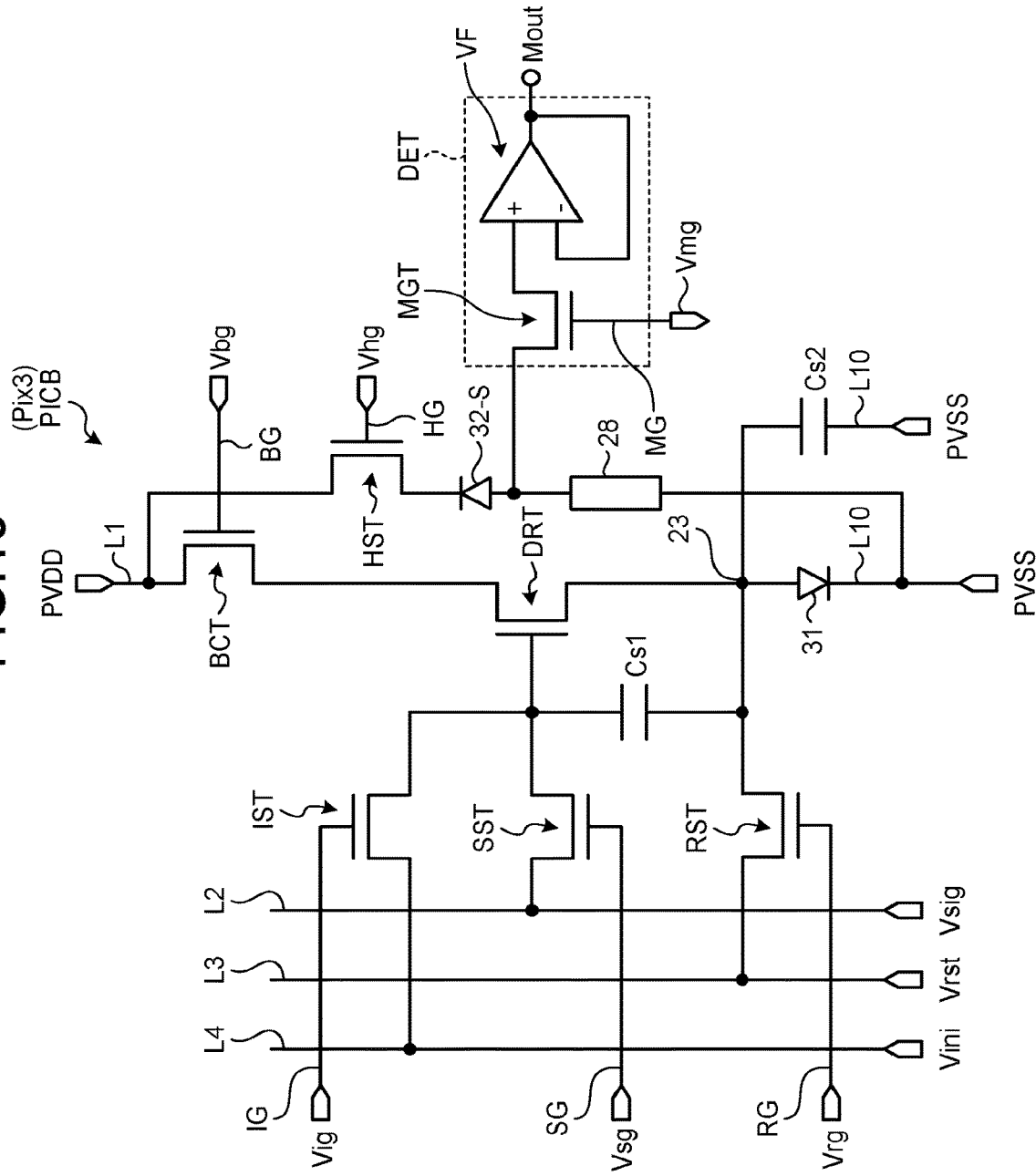
FIG. 13 is a circuit diagram of the pixel circuit included in a third pixel according to the third embodiment.

FIG. 13 is a circuit diagram of the pixel circuit included in the third pixel according to the third embodiment. As illustrated in FIG. 13, the anode of the second light emitting element 32-S for detection is coupled to the cathode power supply line L10 via a resistor 28 in a pixel circuit PICB included in the third pixel Pix3. The cathode of the second light emitting element 32-S for detection is coupled to the anode power supply line L1 via the heat generation control transistor HST. When the heat generation control transistor HST is turned on, the anode (anode terminal 38) of the second light emitting element 32-S for detection is supplied with the cathode power supply potential PVSS, and the cathode (cathode terminal 37) of the second light emitting element 32-S for detection is supplied with the anode power supply potential PVDD.

The anode of the second light emitting element 32-S for detection is also coupled to a detection circuit DET. The detection circuit DET includes a detection control transistor MGT and a voltage follower circuit VF. When the detection control transistor MGT is supplied with detection control signals Vmg from a detection control signal line MG, the detection control transistor MGT is turned on. As a result, the anode of the second light emitting element 32-S for detection is coupled to the voltage follower circuit VF.

When the second light emitting element 32-S for detection is irradiated with light, the second light emitting element 32-S for detection supplies signals corresponding to the light to the voltage follower circuit VF. The voltage follower circuit VF amplifies a photocurrent flowing corresponding to the electric potential of the anode of the second light emitting element 32-S for detection and outputs output signals Mout.

With this configuration, infrared light output from the second light emitting element 32-L for light source is reflected by the surface or the inside of the object to be detected, such as the finger Fg and the palm. The second light emitting element 32-S for detection detects the reflected infrared light, thereby detecting whether the finger Fg is present and various kinds of biological information. The second light emitting element 32-S for detection may perform detection in the display period, the preheating period PH, or the non-display period ND because the second light emitting element 32-L for light source outputs infrared light.

To detect the finger Fg, the second light emitting element 32-L for light source and the second light emitting element 32-S for detection may be driven in any desired manner. The display device 1B, for example, can detect the finger Fg by turning on the heat generation control transistor HST and the detection control transistor MGT coupled to the second light emitting element 32-S for detection in a period when the heat generation control transistor HST coupled to the second light emitting element 32-L for light source is turned on.

While the detection circuit DET includes the voltage follower circuit VF in FIG. 13, the present embodiment is not limited thereto. If the display device 1B performs binary detection, such as touch detection, for detecting whether the finger Fg is present, for example, the detection circuit DET may include a converter instead of the voltage follower circuit VF.

Figure 14:
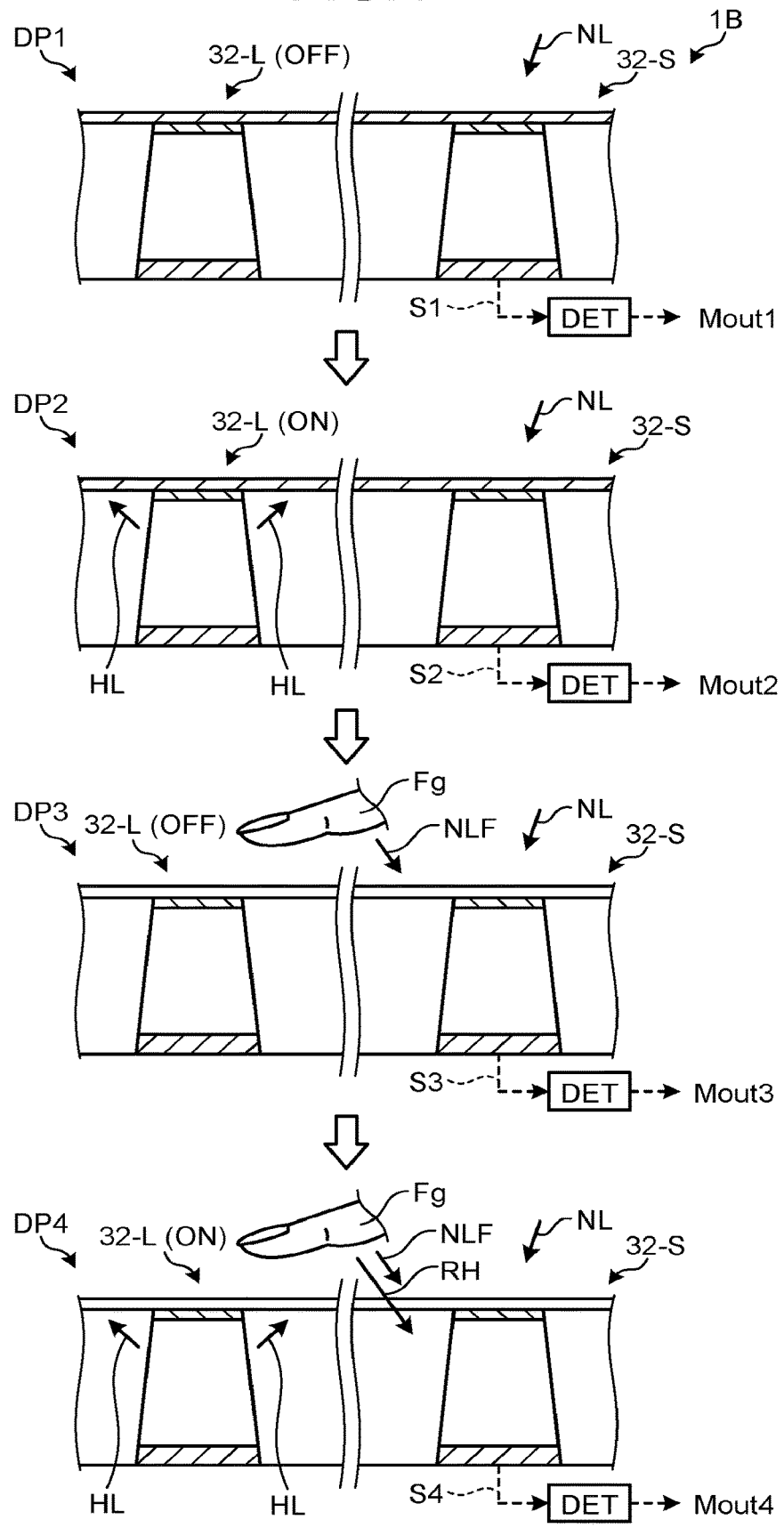
FIG. 14 is a view for explaining an example of a detection method performed by the display device according to the third embodiment.

FIG. 14 is a view for explaining an example of a detection method performed by the display device according to the third embodiment. As illustrated in FIG. 14, the drive IC 210 turns off (OFF) the second light emitting element 32-L for light source in a first detection period DP1 when the finger Fg is not present. As a result, the second light emitting element 32-S for detection outputs a first signal S1 corresponding to incident external light NL. The detection circuit DET amplifies the first signal S1 and outputs a first output signal Mout1.

In a second detection period DP2 when the finger Fg is not present, the drive IC 210 turns on (ON) the second light emitting element 32-L for light source. As a result, the second light emitting element 32-L for light source outputs the infrared light HL. The second light emitting element 32-S for detection outputs a second signal S2 corresponding to the incident external light NL and stray light of the infrared light HL. The stray light of the infrared light HL does not include light reflected by the finger Fg and is components of light traveling in the display device 1B and incident on the second light emitting element 32-S for detection. The detection circuit DET amplifies the second signal S2 and outputs a second output signal Mout2.

An arithmetic unit included in the drive IC 210 calculates an output signal (fifth output signal) due to the stray light of the infrared light HL based on the difference between the first output signal Mout1 and the second output signal Mout2 (Mout2−Mout1).

Similarly, in a third detection period DP3 when the finger Fg is present, the drive IC 210 turns off (OFF) the second light emitting element 32-L for light source. As a result, the second light emitting element 32-S for detection outputs a third signal S3 corresponding to the incident external light NL and external light NLF reflected by the finger Fg. The detection circuit DET amplifies the third signal S3 and outputs a third output signal Mout3.

In a fourth detection period DP4 when the finger Fg is present, the drive IC 210 turns on (ON) the second light emitting element 32-L for light source. As a result, the second light emitting element 32-L for light source outputs the infrared light HL. The second light emitting element 32-S for detection outputs a fourth signal S4 corresponding to the incident external light NL, the stray light of the infrared light HL, the external light NLF reflected by the finger Fg, and reflected light RH reflected by the finger Fg in the infrared light HL. The detection circuit DET amplifies the fourth signal S4 and outputs a fourth output signal Mout4.

The arithmetic unit calculates an output signal (sixth output signal) due to the stray light of the infrared light HL and the reflected light RH reflected by the finger Fg based on the difference between the third output signal Mout3 and the fourth output signal Mout4 (Mout4−Mout3).

The arithmetic unit calculates an output signal due to the reflected light RH reflected by the finger Fg in the infrared light HL based on the difference between the sixth output signal and the fifth output signal.

As described above, the display device 1B may repeatedly turn on and off the second light emitting element 32-L for light source from the first detection period DP1 to the fourth detection period DP4 when the second light emitting element 32-S for detection performs detection. The order of the first detection period DP1 to the fourth detection period DP4 is not limited to that illustrated in FIG. 14 and may be another order.

First Modification

Figure 15:
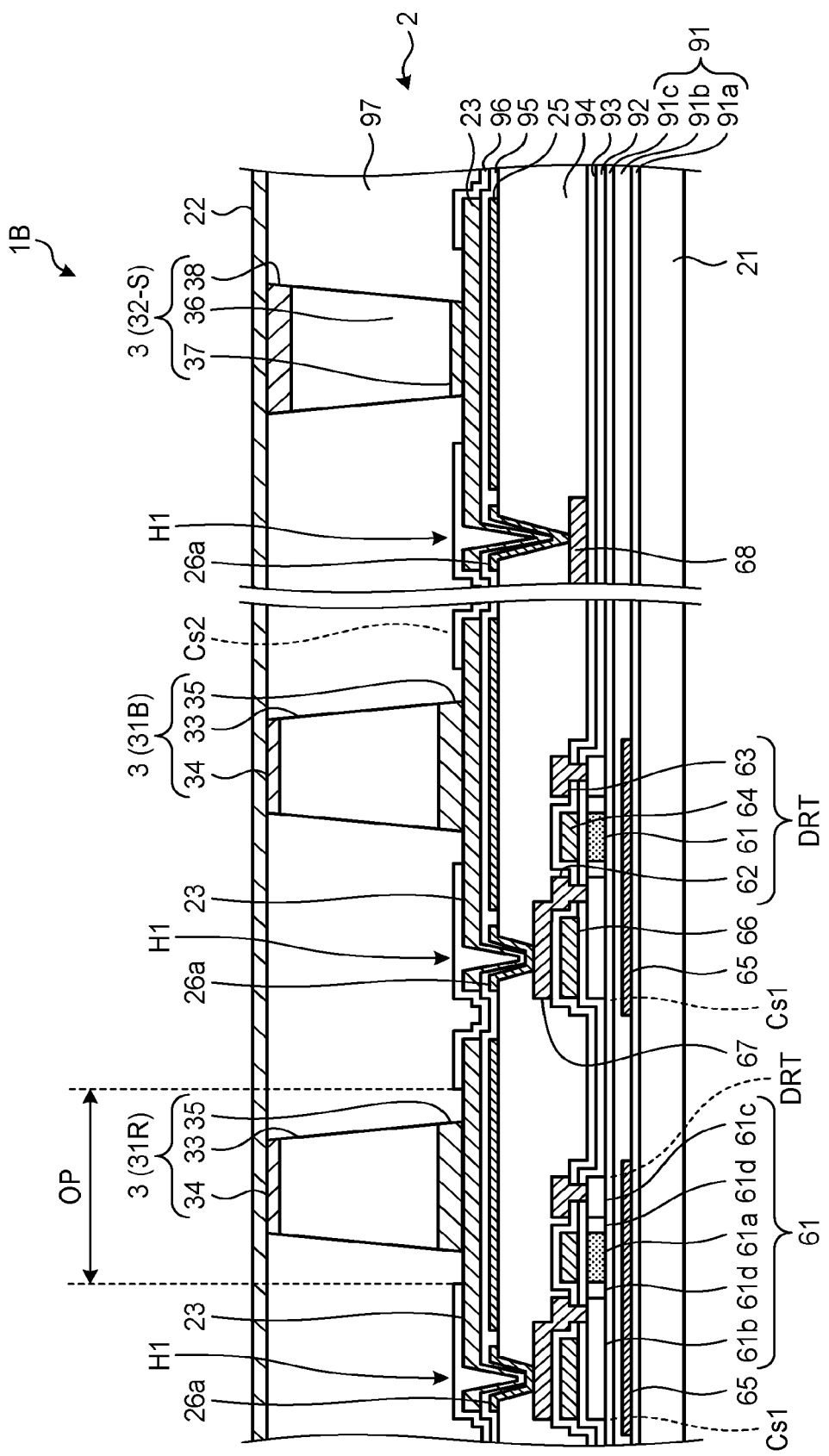
FIG. 15 is a sectional view schematically illustrating the display device according to a first modification of the third embodiment.

FIG. 15 is a sectional view schematically illustrating the display device according to a first modification of the third embodiment. As illustrated in FIG. 15, the second light emitting element 32-S for detection according to the first modification has the same structure as that of the first light emitting element 31. The second light emitting element 32-S for detection is mounted in a manner vertically inverted with respect to the first light emitting element 31. Specifically, the cathode terminal 34 of the first light emitting element 31 is disposed at a position farther away from the substrate 21 than the anode terminal 35 of the first light emitting element 31 is in the direction perpendicular to the substrate 21. The anode terminal 38 of the second light emitting element 32-S for detection is disposed at a position farther away from the substrate 21 than the cathode terminal 37 of the second light emitting element 32-S for detection is.

The cathode terminal 37 of the second light emitting element 32-S for detection is coupled to the anode electrode 23, and the anode terminal 38 of the second light emitting element 32-S for detection is coupled to the cathode electrode 22. In other words, the cathode terminal 34 of the first light emitting element 31 and the anode terminal 38 of the second light emitting element 32-S for detection are coupled to the cathode electrode 22 in common. As a result, the second light emitting element 32-S for detection is driven in reverse bias. The second light emitting element 32-L for light source has the same structure as that of the second light emitting element 32 according to the first embodiment.

Second Modification

FIG. 16 is a timing chart illustrating changes in power supply voltages when the display device according to a second modification of the third embodiment starts. FIG. 16 is a graph schematically illustrating the relation between the signals output from the drive IC 210 and time. The second modification describes an exemplary operation in which the second light emitting element 32-S for detection included in the pixel circuit PICB illustrated in FIG. 13 also functions as a heating light emitting element in the preheating period PH.

As illustrated in FIG. 16, when the display device 1 starts at time ton, power supply voltages VGH and VGL change to respective predetermined electric potentials in a period t11. The power supply voltages VGH and VGL are power supply signals of the drive IC 210. The power supply voltage VGH has a positive potential with respect to a reference potential (e.g., a ground potential GND). The power supply voltage VGL has a negative potential with respect to the reference potential.

Subsequently, the drive IC generates the initialization potential Vini and the reset power supply potential Vrst in a period t12. The initialization potential Vini and the reset power supply potential Vrst are signals having opposite polarities with respect to the reference potential. The initialization potential Vini is a positive potential, and the reset power supply potential Vrst is a negative potential, for example.

Subsequently, the drive IC generates the anode power supply potential PVDD and the cathode power supply potential PVSS in a period t13. In the period t13, a circuit, such as an inverting circuit, included in the drive IC generates signals by inverting the polarities of the anode power supply potential PVDD and the cathode power supply potential PVSS. In other words, the cathode power supply potential PVSS has a positive potential with respect to the reference potential, and the anode power supply potential PVDD has a negative potential with respect to the reference potential.

The drive IC supplies the cathode power supply potential PVSS and the anode power supply potential PVDD the polarities of which are inverted to the second light emitting element 32-S for detection in the preheating period PH. As a result, the second light emitting element 32-S for detection is driven in forward bias and outputs infrared light.

Subsequently, the drive IC causes the cathode power supply potential PVSS and the anode power supply potential PVDD to fall after the end of the preheating period PH in a period t14. The drive IC then stops the operation of the inverting circuit and generates, in a period t15, the cathode power supply potential PVSS having a negative potential and the anode power supply potential PVDD having a positive potential, which are normal polarities. The drive IC outputs the anode power supply potential PVDD and the cathode power supply potential PVSS and controls the first light emitting elements 31 in the frame period 1F. The second light emitting elements 32-S for detection are driven in reverse bias by the anode power supply potential PVDD and the cathode power supply potential PVSS.

The parts that have been described above as the anode terminal 35, 38 and the cathode terminal 34, 37 are not limited to those in the present specification and may be switched depending on the coupling direction of the light emitting element 3 and the application direction of the voltage.

While exemplary embodiments according to the present disclosure have been described, the embodiments are not intended to limit the disclosure. The contents disclosed in the embodiments are given by way of example only, and various changes may be made without departing from the spirit of the present disclosure. Appropriate changes made without departing from the spirit of the present disclosure naturally fall within the scope of the disclosure. At least one of various omissions, substitutions, and changes of the components may be made without departing from the spirit of the embodiments above and the modification thereof.

What is claimed is:

1. A display device comprising:
    a substrate;
    a plurality of pixels provided to the substrate;
    a plurality of first light emitting elements provided to each of the pixels and configured to output visible light;
    a pixel circuit provided to the substrate and configured to supply a drive signal to each of the first light emitting elements; and
    a second light emitting element provided to the pixel circuit and configured to output infrared light, wherein
    the second light emitting element is configured to output the infrared light in a period different from a display period.

2. The display device according to claim 1, wherein
    the first light emitting element and the second light emitting element each include an anode terminal and a cathode terminal,
    the display device comprises:
        a first electrode provided to the substrate and electrically coupled to the anode terminal of the first light emitting element; and
        a first power supply line configured to supply a first potential to the first light emitting element via the first electrode,
    the anode terminal of the second light emitting element is electrically coupled to the first power supply line and is configured to be supplied with the first potential, and
    the cathode terminal of the second light emitting element is electrically coupled to the first electrode and is configured to be supplied with a second potential lower than the first potential.

3. The display device according to claim 1, further comprising:
    an element insulating film provided between the first light emitting elements and covering at least a side surface of the first light emitting elements; and
    a second electrode covering the first light emitting elements and the element insulating film, wherein
    the element insulating film and the second electrode are layered in order on the second light emitting element.

4. A display device comprising:
    a substrate;
    a plurality of pixels provided to the substrate;
    a plurality of first light emitting elements provided to each of the pixels and configured to output visible light;
    a pixel circuit provided to the substrate and configured to supply a drive signal to each of the first light emitting elements; and
    a second light emitting element provided to the pixel circuit and configured to output infrared light, wherein
    a plurality of the second light emitting elements include a second light emitting element for light source configured to output the infrared light and a second light emitting element for detection configured to output a signal corresponding to the infrared light with which the second light emitting element for detection is irradiated, and
    the pixels include:
        a first pixel comprising the first light emitting elements;
        a second pixel comprising the first light emitting elements and the second light emitting element for light source; and
        a third pixel comprising the first light emitting elements and the second light emitting element for detection.

5. The display device according to claim 4, wherein
    the first light emitting element, the second light emitting element for light source, and the second light emitting element for detection each include an anode terminal and a cathode terminal,
    the cathode terminal of the second light emitting element for detection is configured to be supplied with a first potential, and
    the anode terminal of the second light emitting element for detection is configured to be supplied with a third potential lower than the first potential.

6. The display device according to claim 5, further comprising:
    a second power supply line configured to supply the third potential to the first light emitting element, wherein the anode terminal of the second light emitting element for detection is electrically coupled to the second power supply line.

7. The display device according to claim 6, wherein
the cathode terminal of the first light emitting element is disposed at a position farther away from the substrate than the anode terminal of the first light emitting element is in a direction perpendicular to the substrate,
the anode terminal of the second light emitting element for detection is disposed at a position farther away from the substrate than the cathode terminal of the second light emitting element for detection is, and
the cathode terminal of the first light emitting element and the anode terminal of the second light emitting element for detection are coupled to the second electrode in common.

8. The display device according to claim 5, wherein
the cathode terminal of the first light emitting element is disposed at a position farther away from the substrate than the anode terminal of the first light emitting element is in a direction perpendicular to the substrate,
the anode terminal of the second light emitting element for detection is disposed at a position farther away from the substrate than the cathode terminal of the second light emitting element for detection is, and
the cathode terminal of the first light emitting element and the anode terminal of the second light emitting element for detection are coupled to the second electrode in common.

9. A display device comprising:
a substrate;
a plurality of pixels provided to a display region of the substrate;
a plurality of first light emitting elements provided to each of the pixels and configured to output visible light;
a plurality of second light emitting elements provided to a peripheral region of the substrate and configured to output infrared light; and
a plurality of terminals provided to the peripheral region of the substrate, wherein
the second light emitting elements are arrayed along one side of the display region between the terminals and the display region.

\* \* \* \* \*